(12) United States Patent
Blum et al.

(10) Patent No.: US 10,541,090 B2
(45) Date of Patent: Jan. 21, 2020

(54) HIGH PERMITTIVITY NANOCOMPOSITES FOR ELECTRONIC DEVICES

(71) Applicant: SRI INTERNATIONAL, Menlo Park, CA (US)

(72) Inventors: Yigal D Blum, Menlo Park, CA (US); Winston K. Chan, Menlo Park, CA (US); John W. Hodges, Menlo Park, CA (US); David K. Hui, Menlo Park, CA (US); Srinivasan Krishnamurthy, Menlo Park, CA (US); David Brent McQueen, Menlo Park, CA (US); Marc Rippen, Menlo Park, CA (US)

(73) Assignee: SRI International, Menlo Park, CA (US)

( * ) Notice: Subject to any disclaimer, the term of this patent is extended or adjusted under 35 U.S.C. 154(b) by 846 days.

(21) Appl. No.: 14/846,773

(22) Filed: Sep. 6, 2015

(65) Prior Publication Data
US 2016/0005552 A1 Jan. 7, 2016

Related U.S. Application Data

(63) Continuation of application No. PCT/US2014/022201, filed on Mar. 8, 2014.

(60) Provisional application No. 61/775,300, filed on Mar. 8, 2013.

(51) Int. Cl.
| | |
|---|---|
| *H01G 11/56* | (2013.01) |
| *C04B 35/78* | (2006.01) |
| *H01G 9/15* | (2006.01) |
| *H01G 11/84* | (2013.01) |
| *H01M 12/00* | (2006.01) |
| *H01L 29/51* | (2006.01) |

(52) U.S. Cl.
CPC ............ *H01G 11/56* (2013.01); *C04B 35/78* (2013.01); *H01G 9/15* (2013.01); *H01G 11/84* (2013.01); *H01L 29/51* (2013.01); *H01M 12/005* (2013.01); *H01M 2220/10* (2013.01); *H01M 2220/20* (2013.01); *H01M 2220/30* (2013.01)

(58) Field of Classification Search
None
See application file for complete search history.

(56) References Cited

U.S. PATENT DOCUMENTS

| | | | | |
|---|---|---|---|---|
| 5,656,213 A | * | 8/1997 | Sakaguchi | ............ C04B 35/117 264/12 |
| 7,071,258 B1 | * | 7/2006 | Jang | ........................ B82Y 30/00 423/445 B |
| 8,574,681 B2 | * | 11/2013 | Ruoff | ...................... C04B 35/14 427/376.2 |
| 8,962,504 B2 | * | 2/2015 | Corral | ................... C04B 35/632 252/502 |
| 9,833,913 B2 | * | 12/2017 | Jang | ........................ B26B 3/02 |
| 2003/0008123 A1 | * | 1/2003 | Glatkowski | ............ B82Y 10/00 428/294.4 |
| 2010/0021819 A1 | * | 1/2010 | Zhamu | ................... H01G 9/058 429/231.8 |
| 2011/0147723 A1 | | 6/2011 | Hodges, Jr. et al. | |
| 2012/0064409 A1 | * | 3/2012 | Zhamu | ................... B82Y 30/00 429/221 |

FOREIGN PATENT DOCUMENTS

| | | |
|---|---|---|
| WO | WO-2012/006416 A2 | 1/2012 |
| WO | WO-2014/138721 A1 | 9/2014 |

OTHER PUBLICATIONS

Blum et al., "Synthesis and characterization of carbon-enriched silicon oxycarbides", Journal of the European Ceramic Society vol. 25, Issues 2-3, (2005), pp. 143-149.

Kleebe et al. "SiOC ceramic with high excess free carbon" Journal of the European Ceramic Society,vol. 28, Issue 5, (2008), pp. 1037-1042.

Kleebe et al., International Journal of Material Research (formerly Z. Metallkd.) 97 (2006) 6, Part I (pp. 699-709) and Part II (pp. 710-720).

Vomiero et al., "investigation on the oxidation process of SiCO glasses by the means of non-Rutherford backscattering spectrometry", Nuclear Instruments and Methods in Physics Research Section B: Beam Interactions with Materials and Atoms, vol. 211, Issue 3, (2003), pp. 401-407.

International Search Report and Written Opinion dated Jul. 8, 2014 by the International Searching Authority for Application No. PCT/US2014/22201, filed Mar. 8, 2014, and published as WO 2014/138721 on Sep. 12, 2014 (Applicant—SRI International) (7 pages).

International Preliminary Report on Patentability datedf Sep. 8, 2015 by the International Searching Authority for Application No. PCT/US2014/22201, filed Mar. 8, 2014, and published as WO 2014/138721 on Sep. 12, 2014 (Applicant—SRI International) (6 pages).

PCT/US2014/22201 (WO 2014/138721), Mar. 8, 2014, (Sep. 12, 2014), SRI International.

* cited by examiner

*Primary Examiner* — Rena Dye Cronin
(74) *Attorney, Agent, or Firm* — Ballard Spahr LLP

(57) ABSTRACT

The invention pertains to the field of electronic devices and the preparation thereof. In an aspect is an electronic device comprising a nanocomposite of carbon nanodomains homogeneously embedded in an insulating ceramic matrix, wherein the size and distribution of carbon nanodomains is such that the nanocomposite has a permittivity of greater than or equal to 200.

16 Claims, No Drawings

HIGH PERMITTIVITY NANOCOMPOSITES FOR ELECTRONIC DEVICES

CROSS-REFERENCE TO RELATED APPLICATIONS

This Application is a Continuation of International Application No. PCT/US2014/022201, filed on Mar. 8, 2014, which claims the benefit of U.S. Provisional Application No. 61/775,300, filed on Mar. 8, 2013, the contents of which are incorporated herein by reference in their entireties.

BACKGROUND

Society as a whole is moving towards sustainable, renewable, and clean energy sources. Because of on-demand energy requirement the high density energy storage and power delivery systems play a larger role in our lives. They provide solar power in night, wind power when there is no wind, and enable electric cars go longer distances between charging. There continues to be a strong need for energy storage system with high power and energy density to meet the higher requirements of portable electronics to hybrid electric vehicles. Similarly, there is a continuous need to increase energy consumption efficiency directly via lower loss waist energy as well as by means of lighterweight transportation modes and mobile devices. As a part of this trend and further more a growing trend of mobile electronics, there are major attempts to miniaturize electronic devices and their components.

Developments over the past decade of composites containing conductive or very high-permittivity nanoparticles [e.g., Cu, Ag, graphene, $BaTiO_3$, calcium copper titanate (CCTO)] with sizes on the order of 100 nm or less, referred to as nanodielectric or nanocomposite dielectrics, are showing that dielectric materials with certain desired properties can be generated. The observation of potential benefits associated with nanodielectric materials is relatively recent. Since the 1990s, considerable effort has been conducted with respect to nanocomposite dielectric materials utilizing a broad class of polymeric matrices (e.g., polyethylene of assorted densities, cross-linked polyethylene, epoxies, polyimides, polyacrylates, polycarbonates, silicones) that have incorporated a number of different inorganic phases, such as metals, silicates, aluminates, magnesiates, titanates, and a variety of clays. Reported high-permittivity values achieved by such nanodielectric materials have been in the permittivity ($\varepsilon_r$) range of 10 to the high $10^3$, the later being defined as "giant" and "colossal" permittivities.

Materials such as doped barium titanates and CCTO that are polarized are reported to provide $\varepsilon_r$ values in the range of 104 to 105 but are hard and expensive to be made and processed in conjunction with delicate electronic devices. Nevertheless, Ceramic multilayer capacitors with barium titanate as the ceramic dielectric medium are currently the state of the art in the passive capacitor component market. CCTO, having one order of magnitude higher permittivity has not capture a large market share yet, due to the cost of high quality powders and their processing into a viable ceramic component. Once mixed with polymers, the values for these high permittivity materials is dropped by 2 to 3 orders of magnitude, even if added as nanoparticles and in high volume fraction.

There are several significant problems of such highly desired nano dielectric materials—(a) is homogeneous morphologies of such nanocomposites are difficult to process (b) they reach percolation at relatively low volume fraction they pass a percolation threshold and (c) their electrical conductivity increases beyond the values desired for storing electric energy. In other words, they become highly leaking. Attempts to prevent such high leakage are reported but do not provide yet high satisfactory combinations at the very high permittivity range. Furthermore, processing at the industrial level of such nanocomposites is not as reliable as doing it at small lab scales.

Incorporation of graphene into polymeric and ceramic hosts is a new trend in advancing materials for electronic applications. Many of these attempts are associated with the desire to increase the conductivity of the polymers and the ceramics aside from improving their mechanical performance. Increased conductivities of such composites are reported even at values of 1 to 5 vol % of graphene. In all these cases, the graphene or its precursor—graphene oxide—are physically mixed with polymers and ceramic hosts via the use of pre-synthesized graphene or graphene oxide, yet even at a single layer stage (i.e., with a sub-nanometer thickness) their planar dimension is in the micro-range of 0.5 to 10 µm. Graphene oxide is now the new trend in making composites containing homogeneously dispersed graphene platelets. The graphene oxide serves as a practical intermediate that is easily suspended in water and certain organic solvents and this subsequently aids in achieving improved homogeneity of the composite, provided that after the blending it is possible to convert back the graphene oxide to graphene (e.g., by exposure to a gasous reducing agent such as hydrazine, which is very toxic.) Although graphene, organically modified graphene and graphene oxide are traditionally defined as "nanoparticles", it should be noted that in their manufactured stage the nanodimension is just in the thickness of the layer. In contrast, their plane dimensions are in the range between 500 to 10,000 nm, which again reduce their practical potential and lead to percolation phenomena at very low concentrations.

Relevant art: WO 2012/006416; U.S. Pat. No. 8,574,681.

SUMMARY

In an aspect is an electronic device comprising a nanocomposite of carbon nanodomains homogeneously embedded in an insulating ceramic matrix, wherein the size and distribution of carbon nanodomains is such that the nanocomposite has a permittivity of greater than or equal to 200.

In embodiments:
the carbon nanodomains comprise graphene;
the graphene is less than 20 nm in thickness;
the graphene is less than 20 nm in thickness and less than 20 nm in diameter;
the dielectric material is a high dielectric (has a permittivity greater than 200, $10^3$, $10^5$, $10^7$, or $10^{10}$);
the carbon nanodomains constitute between 5-40 vol % of the dielectric material;
the carbon nanodomains constitute between 5-40 vol % of the nanocomposite;
the carbon nanodomains comprise graphene, and wherein the graphene is in the form of single layers, stacks of 2-4 layers, or stacks of more than 4 layers (including, e.g., stacks of 4-12, or 4-10 layers or stacks of more than or equal to 4, 6, 8, or 10 layers, or stacks of less than or equal to 12, 10, 8, or 6 layers), or combinations thereof;
the nanocomposite is a component in a dielectric material;
the nanocomposite is the sole component of a dielectric material (i.e., the nanocomposite constitutes the dielectric material) of the electronic device;

the nanocomposite is a component in a dielectric material, wherein the dielectric material is selected from a film, particle, or bulk material;

the carbon nanodomain volume does not constitute an electrical conduction path (i.e., an electrical conduction path through the nanocomposite);

the carbon nanodomains have dimensions of less than 20 nm;

the carbon nanodomains within bulk nanocomposite uniformly have dimensions of less than 20 nm;

greater than 95% (or greater than 98, 99, or 99.9%) of the carbon nanodomains have dimensions of less than 20 nm;

the carbon nanodomains are thermally formed in situ during formation of the insulating ceramic matrix of the nanocomposite;

the nanocomposite is further disposed/incorporated within a second phase, the second phase comprising a polymer, ceramic, or glass material matrix;

the carbon nanodomain volume does not constitute an electrical conduction path (i.e., an electrical conduction path through the dielectric material comprising the nanocomposite disposed within a second phase);

the carbon nanodomains constitute between 5-40 vol % of the nanocomposite and do not constitute an electrical conduction path through the nanocomposite;

the nanocomposite is a component in a dielectric material, wherein the carbon nanodomains constitute between 5-40 vol % of the dielectric material and do not constitute an electrical conduction path through the nanocomposite;

the nanocomposite is a component (a "first phase") in a dielectric material further comprising a second phase, wherein the carbon nanodomains constitute between 5-40 vol % of the dielectric material and do not constitute an electrical conduction path through the nanocomposite;

the carbon nanodomain volume does not constitute an electrical conduction path, and wherein the volume and distribution of carbon nanodomains provide a permittivity of the nanocomposite that is greater than or equal to 200;

wherein the carbon nanodomains comprise graphene, wherein the carbon nanodomains constitute between 5-40 vol % of the nanocomposite, and wherein the graphene is present as single layers and/or as stacks of 2-4 layers;

wherein the carbon nanodomains comprise graphene, wherein the carbon nanodomains constitute between 5-40 vol % of the nanocomposite, and wherein the graphene is present as stacks of more than 4 layers;

the nanocomposite is further disposed within a second phase (wherein the nanocomposite and the second phase comprise a dielectric material), the second phase comprising a polymer, ceramic, or glass material matrix, and wherein the carbon nanodomains comprise graphene that are single layers or are stacks of 2-4 layers (including combinations thereof), and wherein the volume and distribution of the carbon nanodomains provide a permittivity of the nanocomposite that is greater than or equal to 200;

the nanocomposite is further disposed within a second phase (wherein the nanocomposite and the second phase comprise a dielectric material), the second phase comprising a polymer, ceramic, or glass material matrix, and wherein the carbon nanodomains comprise graphene that are stacks of more than 4 layers, and wherein the volume and distribution of carbon nanodomains provide a permittivity of the nanocomposite that is greater than or equal to 200; and the electronic device is selected from: a capacitor; a hybrid electrochemical battery capacitor; an RF-reactive circuit element; an RF filter; a DRA-type RF antenna; an energy storage device; a pulse power system; a capacitor energy storage device; a distributed capacitor in a microdevice; a component in a field effect transistor (FET); and an integrated component in a very large system integration (VLSI).

In an aspect is an electronic device comprising a dielectric material, the dielectric material comprising a nanocomposite of carbon nanodomains homogeneously embedded in an insulating ceramic matrix, wherein the size and distribution of carbon nanodomains is such that the nanocomposite has a permittivity of greater than or equal to 200.

In an aspect is an electronic device comprising a dielectric material, the dielectric material comprising a nanocomposite of carbon nanodomains homogeneously embedded in an insulating ceramic matrix, wherein the carbon nanodomains have dimensions of less than 20 nm.

In an aspect, there is a method for making the electronic device as above, wherein the nanocomposite is prepared via a method comprising the step: (a) pyrolyzing a composition comprising a precursor or blend of precursors comprising organic and inorganic moieties such that carbon nanodomains are grown in-situ during formation of the insulating ceramic matrix in a controlled content fashion and form the nanocomposite In embodiments:

the method further comprises, prior to step (a), preparing the composition comprising the precursor or blend of precursors;

the method further comprises, prior to step (a), steps: preparing the composition comprising the precursor or blend of precursors; and polymerizing and/or crosslinking the precursor or blend of precursors;

the method further comprises radiating the composition either prior to step (a) or after step (a);

the ceramic matrix of the nanocomposite comprises one or more metallic or semimetallic elements and one or more non-metallic elements;

the ceramic matrix of the nanocomposite comprises one or more metallic or semimetallic elements selected from Si, Al, and B and combinations thereof, and non-metallic elements selected from O, C, N, P and combinations thereof;

the method further comprises, prior to step (a), adjusting the organic content of a precursor composition to provide a desired volume level of the derived carbon nanodomains in the nanocomposite;

the composition comprises a single precursor component, or comprises multiple precursors in a homogeneous blend;

the method further comprises, prior to step (a), polymerizing and/or crosslinking the composition to minimize volatilization or decomposition of the composition below 400° C.

In further embodiments of the electronic device as above:

the carbon nanodomains comprise nano-graphene platelets with a surface area in the range of 1-400 $nm^2$.

the nanopomposite that has very high permittivity value (has a permittivity value greater than 200, $10^3$, $10^5$, $10^7$, or $10^{10}$);

the nanocomposite has very high permittivity value (has a permittivity value greater than 200, $10^3$, $10^5$, $10^7$, or $10^{10}$);

the nano-graphene platelets have a dimension in the range 1-20 nm;

all dimensions (e.g., thickness, diameter) of the carbon nanodomains are less than 20 nm;

the carbon nanodomains constitute between 5-40 vol % (preferably 10-35, more preferably 20-30 vol %) of the nanocomposite;

the nanocomposite is in the form of particles and is further embedded in a second phase;

the nanocomposite is in the form of particles and is further embedded in a second phase, wherein the second phase comprises a polymer matrix or binder;

the nanocomposite is in the form of particles and is further embedded in a second phase, wherein the second phase comprises a ceramic or glassy material matrix or binder;

the carbon nanodomains comprises graphene in the form of single layers and/or stacks of 2-4 layers;

the carbon nanodomains comprises graphene in stacks of more than 4 layers;

the nanocomposite is in the form of a film (thin-film);

the nanocomposite is in the form of a bulk material;

the nanocomposite is a two-phase composite and is in the form of a film (thin-film);

the nanocomposite is a two-phase composite is in the form of a bulk material;

the ceramic component of the nanocomposite is insulative with high resistivity the nanocomposite is insulative with high resistivity, wherein the resistivity of the ceramic component is greater than or equal to $10^5$, $10^{10}$, $10^{15}$, $10^{20}$, etc. $\Omega$*m at STP;

the carbon nanodomain volume does not constitute an electrical conduction path;

the volume and distribution of carbon nanodomains provide the high permittivity of the nanocomposite that is equal to or greater than 200, $10^3$, $10^4$, $10^5$, $10^6$, $10^8$, or $10^{10}$.

the nanocomposite is disposed within a second phase as herein, and the combined nanocomposite disposed in a second phase constitutes a dielectric material, wherein the volume and distribution of carbon nanodomains in the nanocomposite provides a permittivity of the dielectric material (i.e., the nanocomposite disposed within a second phase) that is greater than 20, $10^2$, $10^3$, $10^4$, $10^5$, or $10^6$.

the carbon nanodomains are thermally formed in situ (i.e., form within the nanocomposite as the nanocomposite forms);

the carbon nanodomains are thermally co-formed from precursors in situ alongside the formation of the insulating ceramic matrix;

the carbon nanodomains are thermally co-formed from precursors in situ alongside the formation of the insulating ceramic matrix in thin film architectures, after the precursors are deposited as thin films via wet deposition techniques of thin films;

the carbon nanodomains are thermally co-formed from precursors in situ alongside the formation of the insulating ceramic matrix in thin film architecture, wherein the precursors are processed via chemical vapor deposition (CVD) or solution assisted CVD used for forming thin films in microfabrication processes;

the carbon nanodomains are thermally co-formed from precursors in situ alongside the formation of the insulating ceramic matrix in thin film architectures via sputtering processes, wherein the precursors are a single or a multiple target materials consisting of carbon and ceramic sources;

the carbon nanodomains are thermally co-formed from precursors in situ alongside the formation of the insulating ceramic matrix in the form of fine nanoparticles via aerosol assisted spray pyrolysis techniques;

the precursors are polymeric, sol gel precursors, organometallic compounds, combinations of organic and inorganic compounds and mixtures thereof;

the ceramic matrix comprises the elements Si and O, C, and/or N;

the ceramic matrix further comprises additional metallic elements, such as Al and/or B, and/or additional non-metallic elements such as P;

the ceramic matrix comprises of elements other than Si such as Al and or B in combinations with O, C, and/or N as the main composition of the matrix;

the electronic device is a capacitor, and the nanocomposite is disposed between two electrodes or between parallel plates;

the electronic device is a capacitor, and the nanocomposite is disposed in a second phase as described herein, the two-phase composite constituting a dielectric material, wherein the dielectric material is disposed between two electrodes or between parallel plates;

the capacitor is a multilayer capacitor consisting of stacking such dielectric layers and electrodes on top of each other;

the capacitor is combined with a battery unit to form a hybrid battery capacitor;

the hybrid battery capacitor is a multilayer comprising alternate capacitor and battery module layers;

the hybrid battery capacitor is a battery module surrounded by capacitor units;

the electronic device is an RF or microwave frequency element in an antenna;

the electronic device is an RF-reactive circuit element;

the electronic device is an radio and microwave frequency filter;

the electronic device is a DRA type RF and/or microwave frequency antenna;

the electronic device is an energy storage device and wherein the dielectric is in one or more capacitors connected together (in series or parallel or combinations thereof);

the electronic device is a pulse-power system and wherein the dielectric is in one or more capacitors connected together;

the electronic device is a capacitor energy storage device comprising a capacitor, the capacitor comprising parallel plates or a pair of electrodes, wherein the dielectric further protrudes from the electrodes or parallel plates at an edge;

the electronic device is a distributed capacitor in a microdevice;

the electronic device is a distributed capacitor in a micro device and the electronic device can be an integrated component in a very large system integration (VLSI);

the electronic device is a component in field effect transistor (FET) in a microdevice; and the electronic device is a component in field effect transistor (FET) in a microdevice and the electronic device can be integrated component in a very large system integration (VLSI).

In an aspect is a method for making the device as above, comprising placing the dielectric between first and second electrodes, wherein the dielectric is prepared via the steps: (a) crosslinking a composition comprising a precursor that contains inorganic and organic moieties; and (b) pyrolyzing or radiating the composition at temperatures not higher than 1200° C. such that carbon nanodomains are grown in-situ in a controlled content fashion alongside the formation of a ceramic material and form the nanocomposite, wherein the nanocomposite comprises an inorganic ceramic material consisting of one or more metallic or semimetallic elements and one or more non-metallic elements.

In an aspect is a method for making an electrically responsive (high dielectric, semiconductive, conductive) nanocomposite comprising in-situ generated carbon nanodomains in a ceramic matrix comprising the steps: (a) crosslinking a composition comprising a precursor that contains inorganic and organic moieties; and (b) pyrolyzing or radiating the composition at temperatures not higher than 1200° C. such that carbon nanodomains are grown in-situ in a controlled content fashion and form the nanocomposite, wherein the nanocomposite comprises an inorganic ceramic material consisting of one or more metallic or semimetallic elements and one or more non-metallic elements.

In an aspect, there is a method for making the device as above, comprising placing the high dielectric between first and second electrodes, wherein the high dielectric is prepared via the steps: (a) crosslinking a composition comprising a precursor that contains inorganic and organic moieties; and (b) pyrolyzing or radiating the composition at temperatures equal and lower than 1200° C. such that nanographene layers with dimensions smaller than 20 nm are grown in-situ in a controlled content fashion alongside the formation of a ceramic material and form the nanocomposite, wherein the nanocomposite comprises an inorganic ceramic material consisting of one or more metallic or semimetallic elements and one or more non-metallic elements.

In an aspect is a method for making an electrically responsive (high dielectric, semiconductive, conductive) nanocomposite comprising in-situ generated carbon nanodomains in a ceramic matrix comprising the steps: (a) crosslinking a composition comprising a precursor that contains inorganic and organic moieties; and (b) pyrolyzing or radiating the composition at temperatures equal and lower than 1200° C. such that nanographene layers with dimensions smaller than 20 nm are grown in-situ in a controlled content fashion and form the nanocomposite with the carbon nanocomains comprising graphene in single layers and/or stacks of 2-4 layers (i.e., not more than 4 layers of graphene), wherein the nanocomposite comprises an inorganic ceramic material consisting of one or more metallic or semimetallic elements and one or more non-metallic elements.

In an aspect, there is a method for making the device as above, comprising placing the high dielectric between first and second electrodes, wherein the dielectric is prepared via the steps: (a) crosslinking a composition comprising a precursor that contains inorganic and organic moieties; and (b) pyrolyzing or radiating the composition and further heating the nanocomposite to temperatures equal and below 1500° C. such that in-situ grown nanographene layers form stacks of more than 4 layers of graphene in a controlled content fashion alongside the formation of a ceramic material and form the nanocomposite, wherein the nanocomposite comprises an inorganic ceramic material consisting of one or more metallic or semimetallic elements and one or more non-metallic elements.

In an aspect is a method for making an electrically responsive (high dielectric, semiconductive, conductive) nanocomposite comprising in-situ generated carbon nanodomains in a ceramic matrix comprising the steps: (a) crosslinking a composition comprising a precursor that contains inorganic and organic moieties; and (b) pyrolyzing or radiating the composition and further heating the nanocomposite to temperatures equal and below 1500° C. such that in-situ grown nanographene layers form stacks of more than 4 layers of graphene in a controlled content fashion and form the nanocomposite, wherein the nanocomposite comprises an inorganic ceramic material consisting of one or more metallic or semimetallic elements and one or more non-metallic elements.

Herein is provided the methods above, further comprising heating the evolved nanocomposite (at a temperature below 1500° C., or below 1450° C.) provided that significant carbothermal reduction is avoided.

In an aspect is a method for making the device of above, wherein the nanocomposite is prepared via a method comprising steps: (a) using a single component or multicomponent precursors that contain inorganic and organic moieties, or homogeneously blending precursors containing inorganic and organic moieties; (b) adjusting the organic content to provide a desired volume level of the carbon nanodomains after the completion of Step (d); (c) further polymerizing and/or crosslinking the composition to minimize volatilization or decomposition to volatiles below 400° C. of the reagents; and (d) pyrolyzing or radiating the composition such that carbon nanodomains are grown in-situ in a controlled content fashion and form the nanocomposite, wherein the ceramic phase comprises an inorganic ceramic material consisting of one or more metallic or semimetallic elements and one or more non-metallic elements.

In an aspect is a method for making the device of above, wherein the nanocomposite is prepared via a method comprising steps: (a) using a single component or multicomponent precursors that contain inorganic and organic moieties, or homogeneously blending precursors containing inorganic and organic moieties; (b) adjusting the organic content to provide a desired volume level of the carbon nanodomains after the completion of Step (c); and (c) pyrolyzing or radiating the composition such that carbon nanodomains are grown in-situ in a controlled content fashion and form the nanocomposite, wherein the ceramic phase comprises an inorganic ceramic material consisting of one or more metallic or semimetallic elements and one or more non-metallic elements.

In embodiments:

the method further comprises step: (e) heating the evolved nanocomposite to higher temperatures (but still at or below 1500° C. or below 1450° C.) provided that significant carbothermal reduction is avoided;

the inorganic moiety of the precursor is already bonded to the organic moiety and high fraction of the carbon of the organic moiety remains in the pyrolyzed material;

the organic moiety of the precursor is separated and homogeneously mixed with the inorganic moiety without significant volatilization in the temperature range below 400° C.;

the inorganic moiety of the precursor consists of one or more species selected from a molecule, polymer or a resin having inorganic backbone, metal alkoxide, organometallic compound, metal carboxylate, ketonate, and/or organoamino;

the inorganic moiety of the precursor consists of one or more metallic or semimetallic elements capable of forming oxides, nitrides, oxycarbide, oxynitride, carbonitride and phosphate ceramics;

the metallic and semimetallic elements are selected from Si, Al, and/or B and combinations thereof;

the non-metallic elements are selected from O, N, C, and/or P and combinations thereof;

the organic moiety of the precursor contains aromatic, methyl, alkyl, alkene, multi alkene, cyclopentadiene, alkyne, or nitrile groups as the graphene forming precursors;

a bonded organic-inorganic moiety of the precursor contains a silicon-based compound or polymer comprising Si—H bonds capable of bonding to organic moieties containing one or more reactive alkene sites, (—CH=CH—), via hydrosilylation reaction forming Si—CH$_2$—CH$_2$— bonds;

wherein a Si—H containing compound comprises units of [RSiHO] and R can be O—, methyl, aryl, vinyl, allyl, halide, or alkoxy and these repeating unites reacts with aromatic compounds containing one or more reactive alkene sites;

the alkene containing site is also bonded to a silicon atom participating in the evolved crosslinking network;

the reacting organic compound is selected from modified or non-modified divinyl benzene, divinyl naphthalene and/or styrene;

the inorganic moiety of the precursor contains a silicon-based compound or polymer comprising Si—H bonds capable of bonding to the organic moieties containing one or more reactive hydroxyl sites, $(HO)_x$—R, via dehydrocoupling reaction forming Si—O—C bonds;

the reacting organic compound is selected from modified or non-modified aryl compound containing one or more hydroxyl groups;

the precursor is a silicon-based polymer or resin consists of Si—O—, Si—NR—, Si—$CH_x$— repeating units or mixture thereof;

the ceramic phase is synthesized from reagents consisting of M-X (halide), M-H, M-OH, M-OR, M-O(O═C)R, M-NHR, M-$NR_2$ functional groups in the presence or absence of additional oxygen or nitrogen source (e.g., water, oxygen, ammonia) forming a ceramic phase consisting of M-O-M, M-N-M, M-C-M bonds or combinations thereof;

a catalyst is added to activate the reactions with Si—H, Si—OR, M-O(O═C)R, M-OR, and M-dieketonate;

the polymerization, curing, and/or gelation reactions is/are carried out in a solution or a liquid phase;

the solution is organic or organic-water blend;

the solution is water;

the products of the polymerization, curing, and/or gelation is/are precipitated particles in solution or by aerosol techniques, the particles are further pyrolyzed in a powder form;

the crosslinked or precipitated particles are less than 1 micron;

the crosslinked or precipitated particles are less than 100 nm;

after the formation of precipitated particles in solution or aerosol the particles are further coated with an oxide forming precursor and the evolved coating has a thickness of less than 50 nm (or less than 30, or 20 nm);

the precursor is soluble and polymeric and is deposited as a coating or a thin film via wet techniques prior to the pyrolysis step;

the polymerization/crosslinking and the pyrolysis are simultaneously performed in a gas phase via aerosol or CVD techniques and the nanocomposite is made in the form of particles;

the polymerization/crosslinking and the pyrolysis are simultaneously performed in a gas phase via aerosol or CVD techniques and the nanocomposite is made in the form of a deposited film incorporated in the electronic device structure;

the precursors are a single or multiple solid state target materials serving as the sources for the ceramic and the carbon elements and the high dielectric nanocomposite is deposited as thin film via sputtering techniques;

the nanocomposite with high permittivity is processed in a form of powder and further formulated with an additional polymer, ceramic, or glass binders or matrices.

the combined formulation is used to fabricate the nanocomposite with high permittivity of the electronic device as above.

In an aspect is a capacitor comprising a dielectric disposed between two electrodes or between parallel plates, the dielectric comprising thermally formed carbon nanodomains in a ceramic matrix that are further embedded in a polymer matrix.

These and other aspects will be apparent from the disclosure provided herein. The technical field of the invention is, in certain aspects, electronic devices, electronic materials, and methods of preparation and use thereof.

DETAILED DESCRIPTION OF VARIOUS EMBODIMENTS

In embodiments, the materials described herein have been prepared previously, such as in one or more of the following references: Vomiero et al., *Nuclear Instruments and Methods in Physics Research B* 211 (2003) pp 401-407; Kleebe et al. *Journal of the European Ceramic Society* 28 (2008) pp 1037-1042; Blum et al., *Journal of the European Ceramic Society* 25 (2005) pp 143-149; and Kleebe et al., *International Journal of Material Research* (formerly Z. Metallkd.) 97 (2006) 6, Part I (pp 699-709) and Part II (pp 710-720). The main purpose of that synthesis effort was to assess potential negative effects of incorporating excess carbon into materials that perform at elevated temperatures in oxidative environments as well as to assess the carbothermal reduction activities once the heating is above 1200° C. The research also provided better understanding of how the "free carbon" is formed during the pyrolysis and how graphene or turbostratic carbon domains are evolved.

Parallel activities in the past 10 years have aimed at assessing polymer derived ceramics (PDC) and especially silicon oxycarbides as low dielectric materials (low k) that can replace silica in microfabricated devices. In contrast, other research activities have focused on high temperature conductivity and semi conductivity of PDC and incorporating other conductive particulate components e.g. carbon nanotubes, graphene and graphite to achieve a high temperature conductive ceramic material.

It is now discovered and disclosed herein that such PDC materials with designed excessive levels of carbon (present in carbon nanodomains, also designated herein and in the literature as "free carbon") exhibit very high permittivity, and it is discovered, disclosed, and claimed herein that these materials are suitable for use as dielectric materials (particularly, high dielectric materials) with dialled-in high permittivity (including extremely high permittivity) for appropriately designed electronic devices.

In an aspect is an electronic device comprising a nanocomposite of carbon nanodomains homogeneously embedded in an insulating ceramic matrix wherein the size and distribution of carbon nanodomains is such that the nanocomposite has a permittivity of greater than or equal to 200. Further aspects include methods for making the electronic devices, and methods for making the nanocomposite.

Materials—Composition

The nanocomposites (also referred to as "dielectric materials") described herein comprise "free carbon" domains, which are referred to herein as carbon nanodomains. The carbon nanodomains are defined in the field of polymer-derived ceramics (PDC) as "free carbon", which is the excessive carbon content found in such materials beyond the carbon that is assigned to the ceramic network via stoichiometric calculations. For example the stochiometric assignment for silicon oxycarbide is defined by the formulation of $SiO_xC_{(1-x/2)}$ wherein X is the atomic ratio of O/Si. All the elemental carbon beyond the saturation of the amorphous ceramic network is considered as carbon excess, which its structure and state as a function of precursors, pyrolysis conditions and maximum temperature is still being studied by academic research. Since nanostructural evidence for the carbon domains are not detectable by TEM below heating of the material to above 1200° C., it is clear that the carbon domains are at the very low nanometric level or even trapped as molecular clusters within the ceramic host network. It is understood today that at least part or most of the carbon nanodomains are in the form of nanographene or nanographene like (i.e., graphene fragments and incomplete graphene) form; in embodiment such graphene may contain defects (e.g., rim bonding with the matrix elements such as Si, free "dangling bonds", holes and/or non-planar regions such as bended or twisted regions caused, for example, by tension generated by the ceramic host), and in other embodiments the graphene is defect-free.

The graphene or graphene like state of the excessive carbon which is not yet visible by TEM is assumed based on spectorscopies that reveal signals associated with aromatic and conjugated compounds or graphitic structures. Raman spectroscopy is the most effective spectroscopy to indicate the formation of a carbon based structure that has a characteristic band (G band) associated with graphene and anoter band (D band) that is associated with undefined "distorted" graphene structures. The nature of the distortion is not well studied yet in these systems. The intensity relation between the D and G bands, shown above 900° C. in PDC materials, are used to calculate the size of these distorted graphene domains, which is reported to be in the range of a few nanometers in most cases and in some cases above 10 nm. In the materials reported here, these calculations suggest a graphene dimension around 2 nm. Based on these scientific evidence we define the carbon nanodomains in the nanocomposites as domains with dimensions smaller than 20 nm and that much of this carbon fraction is in a form of graphene, distorted graphene, or graphene like structure.

Once heated above 1300° C., these carbon nanodomains start shifting due to changes in the viscoelastic characteristics of the ceramic host. The graphene domains then begin to form the favorable stack of layers and once reaching a stack of more than 4 layers, they become visible by TEM. Yet, their Raman spectroscopy still indicates distorted graphene domains with very little change in their calculated dimensions. Thus, if these fundamental interpretations are correct, the stacked layers and in some cases the formation of a percolation path are still composed from domains that are only a few nm in size also visually they can show nanoagglomerates of 5 to 20 nm in dimension.

It is believed that the carbon nanodomains may further contain unstructured carbon, carbon clusters, and the like, and all of these forms of carbon are meant to be included by reference to carbon nanodomains. Furthermore, unless indicated otherwise, reference to "graphene" is meant to include both graphene, distorted graphene and graphene like structures (i.e., graphene fragments, incomplete graphene).

The nanocomposites described herein comprise a ceramic matrix material within which the carbon nanodomains are disposed. The combined carbon nanodomains disposed in a ceramic matrix forms a "nanocomposite", which may also be referred to herein as a "first phase".

In embodiments the ceramic matrix material is a silicon-containing material. The silicon-containing material may be an oxide, nitride, or carbide of silicon. Examples of silicon-containing ceramic matrix materials include silicon dioxide, silicon oxycarbide, silicon nitride, silicon carbide, and combinations there. Such materials are prepared from precursor materials as described in more detail herein.

In embodiments, the ceramic matrix material is formed from or with additional elements of Al, B, Ti, Zr, Hf, Ta, Ca, Mg, Sr, Ba, Ru, Co and/or P. Such materials may be in the form of oxides, nitrides, carbides or phosphates and mixtures thereof. For example, the material may be aluminium nitride, aluminium oxide, aluminium carbide, boron oxide, boron carbide, boron nitride, or combinations thereof. The ceramic matrix may alternatively comprise transition metal oxides (e.g., oxides of cobalt, ruthenium or hafnium, any of various titanates, etc.).

In embodiments, the ceramic matrix material is a mixture of the above-mentioned materials and/or atoms, such as silicon oxynitride or silicon oxycarbide with added boron or aluminum, or such as a physical mixture of silicon oxynitride or silicon oxycarbide with boron nitride or aluminum nitride.

In embodiments the ceramic matrix material does not comprise silicon.

The composition of the ceramic matrix material may be any of the above materials or combinations thereof provided that the dielectric of the ceramic matrix is not increased to the point that the conduction threshold is reduced beyond a level useful in the applications described herein.

The ceramic matrix can be made of amorphous, crystalline, nanocrystalline, or combinations thereof.

In embodiments the carbon content of the nanocomposite (i.e., carbon nanodomains disposed within a ceramic matrix) is high, but not so high that the materials is beyond the conduction threshold. The conduction threshold is a function of environmental conditions (e.g., temperature, etc.), so references to a conduction threshold herein (unless otherwise indicated) are meant to refer to a threshold at normal/expected operating conditions of the device for which the nanocomposite is intended for use, or otherwise at STP. In embodiments, the carbon nanodomains content is at the upper level without observing conduction. For example, a 5, 10, 15, 20, or 25% increase in the carbon content results in a material that exhibits conduction, whereas the material without such increase is devoid of conduction under similar conditions. The high carbon content is desired due to the effect of carbon content on permittivity—i.e., higher carbon content (i.e., more graphene content within the material) provides higher permittivity of the nanocomposite and therefore higher permittivity of the resulting dielectric material (i.e., of the nanocomposite where used as a dielectric material or of the two-phase composite as dielectric material).

It is estimated that the resistivity of the combined nanotechnology for obtaining high capacitance and good energy storing (i.e., low leakage) should be in the range of $10^6$ to $10^9$ ohms.

In embodiments, the carbon nanodomains comprise graphene. In embodiments, the content of the graphene is substantially entirely carbon (i.e., 100%, or greater than or equal to 95, 98, 99, or 99.9 wt %), and substantially no other atoms in the graphene plane. However, bonding of other atoms at the edges of the graphene or the carbon cluster are anticipated. Most likely these bonding will be with the Si or other metallic elements and hydrogen and less likely bonding with oxygen. In embodiments, the graphene contains substantially no grapene oxide patterns and oxidized functional groups, associated with intentionally formed graphene oxide as it would be developed in a reducing environment during the pyrolysis. Furthermore, in embodiments, the graphene is not an organic-functionalized graphene—i.e., there are no or substantially no organic functional groups such as acid groups, carbonyl groups, or the like covalently bonded to the graphene material.

Within the nanocomposite, the carbon nanodomains constitute between 5-40, or 10-35, or 20-30 vol %, or greater than or equal to 5, 10, 15, 20, 25, 30, or 35 vol %, or less than or equal to 40, 35, 30, 25, 20, 15, or 10 vol %, with the remaining volume occupied by the ceramic matrix.

In embodiments the combination of the carbon nanodomains and the ceramic matrix within which the carbon nanodomains are distributed forms a first phase (i.e., nanocomposite, which, in some embodiments, is the sole component) of the dielectric materials described herein. In embodiments, the nanocomposite is further distributed within a second phase, wherein the second phase forms a matrix and the nanocomposite forms domains within the matrix. Herein, a material comprising the nanocomposite disposed/distributed within the second phase is referred to as a "two-phase composite". In embodiments, the nanocomposite is in the form of particulates (i.e., is a powder) and is distributed/disposed within the second phase. Powders include those with particle sizes in the sub-micron range as well as the micron range (e.g., less than 1, 0.8, 0.6, 0.4, 0.3, 0.2, or 0.1 micron, or greater than 1 micron). Powders may be surface oxidized as appropriate (e.g., via thermal heating in oxidative environment, plasma exposure, chemical oxidizers, etc., and combinations thereof). In embodiments, the term "dielectric material" as used herein refers to the nanocomposite material alone. In embodiments, the term "dielectric material" as used herein refers to the two-phase composite.

In embodiments, the second phase is an organic polymer, or an inorganic ceramic, or a glassy material. In embodiments, the second phase provides a non-conducting (i.e., insulating) structural element, such as a flexible component that enables the dielectric material to be formed to any suitable shape. In embodiments, the second phase further reduces the conductivity of the dielectric material, i.e., increases the breakdown voltage of the dielectric material.

For example, the second phase is a matrix of an organic polymer. Suitable polymers include PVDF, polyacrylates, polyesters, polyamides, polyols, polyfluorinatedhydro carbons, polyamines, polyorganic acids, ionomers, polyolefins, polyhydrocarbons, polysiloxanes and polyurethanes.

In embodiments, the second phase is a ceramic material including amorphous ceramic materials or a glassy material, such as low dielectric e-glass or low melting point borosilicate.

Within the two-phase dielectric material, the nanocomposite constitutes 10 to 90 vol %, such as 30 to 70 vol %, or such as greater than or equal to 10, 20, 30, 40, 50, 60, 70, or 80 vol %, or such as less than or equal to 90, 80, 70, 60, 50, 40, 30, or 20 vol %, with the remaining volume occupied by the material of the second phase.

The dielectric material (either the nanocomposite alone, or the two-phase composite) may be further disposed on a substrate, such as a conducting substrate. Substrates include electrodes and conducting plates, such as in capacitors as described herein. Substrates include conductive materials such as metals and conductive carbon, semi-conductive materials (e.g., silicon, germanium titania, zinc oxide, tin oxide, indium tin oxide, III-V and II-VI semiconductors and combinations thereof), and the like.

Material—Physical and Electrical Properties

As described herein, the dielectric materials disclosed herein comprise a nanocomposite having carbon nanodomains disposed within a ceramic matrix, and the nanocomposite may further be disposed within a second phase. The physical properties of such materials are described by size, crystallinity, dimensions, and other factors, while the electrical properties of the materials include conductivity and permittivity.

The carbon nanodomains have dimensions of less than 20 nm. By "dimensions" is meant thickness as well as diameter or the planer size of a platelet, where such terms are appropriate. Thus, the thickness of the carbon nanodomains is less than 20 nm, and the diameter of the carbon nanodomains is also less than 20 nm. Generally, spherical carbon nanodomains have only a diameter measurement. Carbon nanodomains having a non-unity aspect ratio will have a thickness as well as a diameter, wherein the "diameter" refers to the largest measurement in the x-y (i.e., lateral) dimension of the nanodomain (the z dimension then refers to the thickness of the nanodomain).

In embodiments, the carbon nanodomains comprise graphene, including graphene "sheets" or "layers". A graphene layer has a thickness of a single layer of carbon, which is on the order of less than 0.5 nm in thickness, although the sheets may be stacked as described herein. The sheets also have a "diameter", which as used herein refers to the largest measurement in the x-y (i.e., lateral) dimension of the sheet, and a "surface area", which as used herein refers to the x-y (i.e., lateral) dimension surface area of one side of the sheet. Thus, for example, the thickness of the carbon nanodomain is less than 0.5 or less than 0.2 nm if the graphene is present as a single layer.

In embodiments, the carbon nanodomains comprise graphene sheets having a diameter in the range 1-20, 2-20, 2-15, or 2-10 nm, or greater than or equal to 2, 3, 5, 8, 10, 13, 15, or 18 nm, or less than or equal to 20, 18, 15, 13, 10, 8, 5, or 3 nm. The sheets with such diameters may be any 2-dimensional shape, such as circular, rectangular, square, or irregular, or combinations thereof. Furthermore, the surface area of the sheets is in the range of 1-400, 1-300, 1-200, or 1-100 nm$^2$, or is greater than or equal to 1, 10, 50, 100, 150, 200, 250, 300, or 350 nm$^2$, or is less than or equal to 400, 350, 300, 250, 200, 150, 100, 50, or 10 nm$^2$. Furthermore, the "rim length" which is the measure of the 1-D length of the edge of a graphene sheet or stack of sheets is in the range 4-100, 5-50, or 5-35 nm, or is greater than or equal to 4, 5, 10, 15, 20, 25, 35, or 50 nm, or is less than or equal to 100, 50, 35, 25, 20, 15, or 10 nm.

In embodiments, the graphene sheets exist as single isolated sheets—i.e., there is no stacking of the sheets. In embodiments, the graphene sheets are stacked in stacks of between 2-4 sheets, such as stacks of 2, 3, or 4 sheets, or combinations thereof. In embodiments, the graphene sheets are staked in stacks of more than 4 sheets, such as 5-12 or 5-10 sheets. Combinations of these embodiments are also possible. For example, single sheets can exist in a material that also contains stacks of between 2-4 sheets. In embodiments, the material contains single sheets and stacks having no more than 4 sheets. Given the thickness of the graphene sheet, and the number of sheets in a stack, the thickness of the graphene sheet stacks as found in the carbon nanodomains is less than 20, 15, 10, 5, or 3 nm. Accordingly, the single graphene sheets or graphene sheet stacks found in the carbon nanodomains disclosed herein have no dimension that is greater than 20 nm (i.e., the thickness and diameter are both less than or equal to 20 nm).

Without wishing to be bound by theory, it is believed that the in situ formation of the carbon nanodomains (described in more detail herein) leads to the relatively small size of the domains compared with other methods of preparation. For example, the carbon nanodomains described herein comprise graphene having a surface area that is 0.001, 0.01, 0.1, or 1% of the surface area of commercially available graphene oxide and of graphene prepared by reduction of graphene oxide.

In embodiments the carbon nanodomains are homogeneously distributed within the ceramic matrix, except perhaps the outer surface, which may be carbon rich with a nanometric layer of carbon that can be formed via organic gases, evolved during the pyrolysis and redeposited by their decomposition at the surface like in CVD reactions.

For example the density of domains (i.e., the number of carbon nanodomains and/or the total volume of carbon nanodomains in a given unit of area) does not vary or varies by less than 10, 5, 3, 1, or 0.5% throughout the material. Also for example, the material is isotropic in that, along any given line through the material, the volume fraction of carbon nanodomain relative to ceramic matrix is substantially the same (i.e., does not vary or varies by less than 10, 5, 3, 1, or 0.5%) throughout the material.

However, it is anticipated that at the surface of the bulk, or particles, or films there will be excessive level of carbon nanodomains. A need to burn out the surface excess carbon by controlled oxidation is therefore anticipated.

If the nanocomposite is formed as powder, it is possible to slightly oxidize the surface or form an outer oxide layer by a secondary deposition of a low dielectric ceramic composition. It can assist the required resistivity and decrease the leakage. Aside from a controlled oxidation of the particle surface by heating at elevated temperature, it is possible to deposit a thin oxide film of a low dielectric material such as silica or alumina in the range of less than 50 nm thick by fluidized bed techniques or by solution coating with a preceramic polymer or sol gel solution followed by heating rapidly the coated particles at elevated temperature in oxidative environment.

The carbon nanodomains are isolated from one another by ceramic matrix material; thus, in embodiments, the physical characteristics (e.g., diameter, surface area) as described above for a sheet or a stack of sheets also corresponds to the physical characteristics of each separate/individual carbon nanodomain. This is particularly the case where the carbon nanodomain comprises graphene and no other forms of carbon. Thus, for example, disclosure herein of single graphene sheets having a surface area of 400 nm$^2$ may also correspond to individual carbon nanodomains having the same surface area.

As described herein, the nanocomposite comprises a ceramic matrix. The ceramic matrix physically and electrically isolates each of the carbon nanodomains from the other carbon nanodomains, thereby ensuring that the nanocomposite does not constitute a conduction path. Accordingly, the ceramic matrix material is highly insulating (e.g., having resistivity of above $10^8$, $10^{10}$, $10^{12}$, or above $10^{14}$ Ω·m) and can be used as the ceramic component. If for example the ceramic matrix will be silica only, the resistivity of the component will reach up to $10^{17}$ Ω·m and values reported for SiOC are in the range of $10^{10}$ to $10^{11}$ Ω·m.

The ceramic matrix material component may be crystalline, amorphous, or a combination thereof such as partially crystallized. The ceramic material component may comprise nanocrystallites. Any of these descriptors may be applied to the ceramic matrix materials described elsewhere herein, as appropriate. For example, the ceramic matrix may be amorphouse silicon oxycarbide, or silicon carbide with nanocrostallites, etc.

The nanocomposite material has an associated permittivity, and the dielectric material comprising nanocomposite disposed and distributed within the second phase also has an associated permittivity. In embodiments, such permittivities are not equal, and the nanocomposite material has a permittivity that is greater than the permittivity of the second phase and/or of the two-phase composite by a factor of at least 10, $10^3$, or $10^6$. Once embedded in the lower dielectric second phase the combined permittivity of the dielectric material with extremely high permittivity nanocomposites in a second phase can drop by 2 to 4 orders of magnitude compared with the nanocomposite alone.

In embodiments, the volume and distribution of carbon nanodomains provide a permittivity of the nanocomposite that is equal to or greater than or qual to 200, 1000, 10000, 100000, $10^6$, $10^8$, or $10^{10}$. For example, the permittivity of the nanocomposite is within the range 200-$10^{10}$, or 1000-$10^{10}$, or $10^4$-$10^{10}$, or $10^5$-$10^{10}$, or $10^6$-$10^{10}$. These values also apply to the "dielectric material" as described herein when the dielectric material is the nanocomposite material. The concentration of the carbon nanodomains and the maximum temperatures they are taken too are the main contributors to achieving the extremely high values of permittivity.

In embodiments of the two-phase composite, the volume and distribution of carbon nanodomains in the nanocomposite and the volume and distribution of the nanocomposite within the second phase provides a permittivity of the two-phase composite that is greater than or equal to 200, 500, 1000, 10000, 100000, $10^5$, or $10^6$.

For example, the permittivity of the two-phase composite is within the range 200-$10^6$, or 1000-$10^6$, or $10^4$-$10^6$, or $10^5$-$10^6$. These values also apply to the "dielectric material" as described herein when the dielectric material comprises the two-phase composite.

In the devices herein, in embodiments, the carbon nanodomain volume does not constitute an electrical conduction path. Since conduction is a temperature dependent phenomenon, this phrase is understood to mean that the carbon nanodomain volume does not constitute an electrical conduction path at the operational temperater range of the device. For example, if the device is a capacitor suitable for operation within the range of −50° C. to 300° C., then the carbon nanodomain volume is prepared such that the nanocomposite does not constitute an electrical conduction path (and therefore allow conductivity through the nanocomposite) at least within that temperature range. Typical operating temperature ranges for the devices herein include as low as −10, −30, −50, or −100° C., and as high as 250, 300, 350, 400, or 450° C.

In embodiments, the carbon nanodomain volume within the nanocomposite is such that the nanocomposite is non-conductive and constitutes an electrical conduction path with a conductivity below $10^{-5}$, $10^{-6}$, $10^{-7}$, $10^{-8}$, $10^{-9}$, or $10^{-10}$ S/m. In embodiments, the carbon nanodomain volume within the nanocomposite is such that the nanocomposite is semiconductive and constitutes an electrical conduction path with a conductivity above $10^{-5}$, $10^{-4}$, $10^{-3}$, $10^{-2}$, or $10^{-1}$ S/m.

Material—Formation

The nanocomposites described herein can be prepared by a variety of methods, all of which involve in situ thermal formation of the carbon nanodomains. In situ thermal formation results in a number of structural and procedural differences that distinguish the material from other materials such as chemically formed materials (e.g., reduction of graphene oxide).

Furthermore, the carbon nanodomains are formed in tandem (i.e., simultaneously) with the ceramic matrix material. Thermal treatment (also referred to as pyrolysis) of a precursor or a mixture of precursors therefore simultaneously form the carbon nanodomains and the surrounding ceramic matrix—i.e., the nanocomposite. The temperature profile of the thermal treatment and the identity of the precursor (or precursor mixture) are factors determining the resulting nanocomposite. The process does not involve chemical oxidation or reduction reactions to convert carbon (e.g., to form graphene oxide and then to reduce to graphene). Details of the thermal treatment are provided in the Examples herein, as well as the following disclosure.

The precursor material may be a single compound or a mixture of precursor compounds, and reference herein to a "precursor" or "precursor material" is, unless otherwise indicated, meant to include both instances. The precursor may be a polymeric material, a small molecule, or a sol gel material, or a combination thereof.

In embodiments, the precursor material is an organometallic compound. Examples include organosilicon compounds and the like. In embodiments the precursor comprises organic and inorganic moieties. For example, the material is polymeric comprising organic moieties on an inorganic (e.g., metal-containing) backbone. In embodiments the precursor is a silicon-containing material, such as an organosilicon material.

In embodiments the precursor is a silicon-containing soluble polymer such as PHMS, MK and MQ resins, or a silicon-containing small molecule such as tetraalkoxysilane, hydrotrialkoxysilane, methyltrialkoxysilane, phenyltrialkoxysilane, Phenyltrichlorosilane, vinyltrichlorosilane, etc. In embodiments the material is a silicate glass precursor such as a polysiloxane (including oligomeric siloxanes, cyclic siloxanes, etc.) and polymers derived from hydrolysis condensation of alkoxysilanes and organoalkoxysilanes, which may have any of a number of organic functional groups such as alkyl (methyl, ethyl, etc.), alkenyl (vinyl, etc.), alkynyl, and the like.

The temperature of in situ formation may be adjusted to vary the final materials. The thermal formation generally requires temperatures between 800-1400 or 1000-1200° C. For lower temperatures between 800-1200° C., the carbon nanodomains contain a relatively large percentage of single graphene sheets. Increases in temperature result in stacked graphene. For example, stacks of 4 or more sheets are produced by increasing the temp of the in situ formation to above 1300° C. Accordingly, in embodiments, the temperature of in situ formation for the nanocomposites described herein is between 800-1500, 800-1400, 1000-1400, or 1000-1200° C., or equal to or above 800, 1000, 1200, 1300, 1400, or 1450° C., or less than or equal to 1500, 1450, 1400, 1300, 1200, 1000, or 900° C.

A significant effect due to the in situ formation method disclosed herein (i.e., that is different from chemical or physical methods of preparation) is the electron conduction threshold. Generally, larger carbon domains provide a higher likelihood that the domains will touch each other in the nanocomposite (thereby providing a conduction pathway at low concentration of the graphene domains). Therefore, the percolation threshold for graphene in nonconductive hosts is reported in some literature to be below 1 vol %. The materials described herein may reach over 40 vol % (based on assigning a density of 1.8 to 2.0 for all the free carbon content) before room temperature percolation is reached after the carbon nanodomains are in-situ formed at 1000° C. With an increase in the temperature to above 1200° C., the carbon nanodomains start to shift in the ceramic matrix and self form connections and stacks that increase dramatically the conductivity with the same Vol % of carbon nanodomains. Yet, according to analysis and calculations, the size of the individual carbon nanodomains in the percolated system remains about the same.

Thin films of the nanocomposite can be made using CVD or by wet coating (e.g., spin coating) followed by crosslinking and pyrolysis of the formed film. CVD may involve the use of organic and aromatic compounds that are deposited and pyrolyzed to form the nanocomposite. CVD and wet coating of thin films are direct deposition methods, and in embodiments therefore provide a dielectric material with only the first phase (i.e., the nanocomposite) as a thin film or bulk material—there is no polymeric second phase in such materials. Sintering methods may further be used to prepare the nanocomposite as a bulk material that do not contain a second phase.

In an aspect is a method for making an electrically responsive (high dielectric, semiconductive, conductive) nanocomposite consisting of an in-situ generated carbon nanodomains in a ceramic host by: (a) synthesizing a composition comprising a precursor that contains inorganic and organic moieties, or forming the composition by homogeneously blending precursors containing inorganic and organic moieties; (b) crosslinking the composition to minimize volatilization (of any of the various components in the composition, or of specific components that lead to the formation of the composition); (c) pyrolyzing and/or radiating the composition to form an inorganic ceramic material consisting of one or more metallic or semimetallic elements and one or more nonmetallic elements (e.g., N, O, C, and/or P) in which nanographene domains are grown in-situ in a controlled content fashion; and (d) optionally further heating the evolved nanocomposite to higher temperatures provided that significant carbothermal reduction is avoided. In embodiments: the inorganic moiety is bonded to an organic moiety prior to step (a); the organic moiety remains bonded to the inorganic moiety up to the pyrolysis step; the organic moiety is debonded from the inorganic moiety prior to the pyrolysis but is not removed from the composition by evaporation; the organic moiety is separately polymerized (condensed) homogeneously side by side to the inorganic moiety; the inorganic moiety consists of one or more species selected from an inorganic polymer, alkoxy metal, organometal, carboxylate metal, ketonates, organo-amido, and/or organophosphine, the organic moiety contains aromatic, methyl, alkene, multi alkene, alkyne or nitrile groups; the inorganic moiety consists of one or more metallic or semimetallic elements (e.g., Si, Al, B, Ti, Zr, Hf, Ba, Ca, Mg, and/or Sr, particularly Si, Al, and/or B); the inorganic moeity contain one or more nonmetallic elements (e.g., N, O, C, and/or P); the inorganic moiety contains a silicon-based compound or polymer with Si—H bonds capable of bonding to organic moieties containing one or more reactive alkene sites, (—CH=CH—), via hydrosilylation reaction forming Si—$CH_2$—$CH_2$— bonds; the inorganic moiety contains a silicon-based compound or polymer with Si—H bonds capable of bonding to the organic moieties containing one or more reactive hydroxyl sites, $(HO)_x$—R, via dehydrocoupling reaction forming Si—O—C bonds; the silicon compound or polymer contains additional bonded organic groups; the silicon polymer consists of [Si—O], [Si—NR], [Si—$CH_x$] repeating units or mixture thereof; the inorganic network is synthesized by reacting M-X, M-OH, M-OR, M-O(O=C)R, M-NHR, M-$NR_2$ with water completely or partially to form M-O-M condensation products; the organic group R serves as a source for in-situ formation of carbon nanodomains domains; the following are in the same composition during the synthesis: the inorganic moiety contains a silicon-based compound or polymer with Si—H bonds capable of bonding to organic moieties containing one or more reactive alkene sites, (—CH=CH—), via hydrosilylation reaction forming Si—$CH_2$—$CH_2$— bonds, and the inorganic moiety contains a silicon-based compound or polymer with Si—H bonds capable of bonding to the organic moieties containing one or more reactive hydroxyl sites, (HO)$_x$—R, via dehydrocoupling reaction forming Si—O—C bonds; the following are in the same composition during the synthesis: the inorganic moiety contains a silicon-based compound or polymer with Si—H bonds capable of bonding to organic moieties containing one or more reactive alkene sites, (—CH=CH—), via hydrosilylation reaction forming Si—CH$_2$—CH$_2$— bonds, and the inorganic network is synthesized by reacting M-X, M-OH, M-OR, M-O(O=C)R, M-NHR, M-NR$_2$ with water completely or partially to form M-O-M condensation products; the following are in the same composition during the synthesis: the inorganic moiety contains a silicon-based compound or polymer with Si—H bonds capable of bonding to the organic moieties containing one or more reactive hydroxyl sites, (HO)$_x$—R, via dehydrocoupling reaction forming Si—O—C bonds; and the inorganic network is synthesized by reacting M-X, M-OH, M-OR, M-O(O=C)R, M-NHR, M-NR$_2$ with water completely or partially to form M-O-M condensation products; the reaction is carried out in a solution; the solution is organic or organic-water blend; the solution is water; a catalyst is added to activate the reactions with Si—H, Si—OR, O(O=C)R and dieketonate; the Si—H containing compound comprises repeating units of [RSiHO] and R can be H, methyl, aryl, vinyl, allyl, halide, or alkoxy and it reacts with aromatic compounds containing one or more reactive alkene sites; the reacting organic compound is selected from modified or non-modified divinyl benzene, divinyl naphthalene and/or styrene; the Si—H containing compound comprises repeating units of [RSiHO] and R can be H, methyl, aryl, vinyl, allyl, halide, or alkoxy and it reacts with aromatic compounds containing reactive alkene sites; the reacting organic compound is selected from modified or non-modified aryl compound containing one or more hydroxyl groups; after the formation of a crosslinked or precipitated powder in solution, the powder is further coated with an oxide forming precursor and the evolved coating has a thickness of less than 20 nm; the crosslinked or precipitated particles are less than 1 micron; and the crosslinked or precipitated particles are less than 100 nm.

Thin films can be also made by sputtering techniques, in which the carbon nanodomains are thermally co-formed in situ alongside the formation of the insulating ceramic matrix in thin film architectures via sputtering processes, wherein the solid state precursors in the form of a single target such as carbon rich SiOC or a multiple target materials such as one is carbon and one is silica are used to generate atoms of carbon and ceramic constituents and the atoms are then deposited from a gas phase at the surface of a designated substrate, forming a thin film of the nanocomposite.

In embodiments the carbon nanodomains are thermally co-formed from precursors in situ alongside the formation of the insulating ceramic matrix in the form of fine nanoparticles via aerosol assisted spray pyrolysis techniques.

Devices

The materials described herein are suitable for use as a dielectric material in electronic devices. In embodiments, the electronic device is selected from: a capacitor; a hybrid electrochemical battery/capacitor; a RF reactive circuit element; an RF filter; a DRA-type RF antenna; an energy storage device; a pulse power system; a capacitor energy storage device; a distributed capacitor in a microdevice; a component in a field effect transistor (FET); and an integrated component in a very large system integration (VLSI). In embodiments The term electronic device used herein can be a self pending device, such as a large capacitor; a component in a larger system that constitutes an electronic device, such as embedded capacitor in a microelectronic device or an RF component; a critical element that enables a better component and/or device, such as in the case of FET.

In embodiments the electronic device is a capacitor in which the dielectric material is disposed between and contacting first and second electrodes. In embodiments the electronic device is a parallel plate capacitor in which the dielectric material is disposed between and contacting parallel plates. As applied in capacitor configurations, it is desirable to use a nanocomposite consisting of carbon nanodomains comprising graphene in stacks of no more than 2-4 layers and/or single isolated graphene sheets.

In embodiments the electronic device is a capacitor energy storage device comprising at least two multilayer interleaved structures, each multilayer interleaved structure comprising at least one layer of the dielectric material as a thin-film or bulk material and that is positioned between two electrode layers and protrude from between said electrode layers at one edge, wherein at least two of said multilayer interleaved structures of dielectric and electrode layers are placed in parallel. In embodiments: the device further comprises a substrate layer of having at least two opposite sides wherein said multilayered interleaved structure is positioned on one side of said layer; said multilayered interleaved structure is positioned on one side of said substrate layer and a second multilayered interleaved structure is positioned on the opposite side of said substrate layer; the device further comprises a capping layer placed over said multilayered interleaved structure, wherein said capping layer is a high-conductivity metal; and at least two of said multilayer interleaved high dielectric layers composed of said nanocomposites embedded in a polymer phase and electrode layers are placed in parallel.

In embodiments the electronic device is a capacitor energy storage device as above and further comprising a substrate layer having at least 2 opposite sides wherein said multilayered interleaved structure is positioned on one side of said layer, wherein said structure is configured for high power density.

In embodiments the device is a pulse-power system. Such system comprises a capacitor as described herein. Such system further comprises a series of capacitors connected together and also connected to a power generator.

In embodiments the electronic device is a component on a printed circuit board, the PCB comprising: a planar top outer layer; a planar bottom outer layer; and a planar capacitive core element disposed in parallel relation between the top outer layer and bottom outer layer, wherein the capacitive core element comprises electrically conductive layers and a dielectric layer disposed therebetween, and wherein the dielectric layer comprises the nanocomposite described herein.

In embodiments of the PCB as above, the nanocomposite is further disposed within a second phase, the second phase comprising a polymer matrix film electrically insulative material, wherein the dielectric plane has a dielectric constant more than 100 times greater than a dielectric constant of the electrically insulative material, In embodiments of the PCB as above, said capacitive core element comprises a plurality of dielectric planes, each of said dielectric planes being separated by an electrically conductive element.

In embodiments of the PCB as above, at least one of said planar outer layers comprises connection points for interconnecting a plurality of components mounted thereupon.

In embodiments of the PCB as above, the nanocomposite has a dielectric constant more than 100 times the dielectric constant of the electrically insulative material.

In embodiments the electronic device is a hybrid energy storage system comprising: (a) a first energy storage device including an electrochemical battery wherein the battery is selected from the group consisting of lead-acid batteries, nickel cadmium batteries, nickel metal hydride batteries, lithium ion batteries, lithium polymer batteries, and combinations thereof having an electrode used as an anode and an electrode use as a cathode for providing a substantially constant power output; and (b) a second energy storage device directly electrically and mechanically linked to the first energy storage device and including a high capacitive core element disposed in parallel relation between said anode or cathode and a conductive outer layer, said capacitive core element including an electrically conductive conductor connected to either the anode or cathode of the said first energy storage device, and a dielectric disposed therebetween, said dielectric comprising bulk graphene domains that are single layers or are layers in stacks of 2-4 layers, and wherein the volume and distribution of graphene domains provide a permittivity of the first phase that is greater than or equal to 200 that are further embedded in a polymer matrix dielectric or thermally formed bulk graphene domains are single layers or are layers in stacks of 2-4 layers, and wherein the volume and distribution of graphene domains provide a permittivity of the first phase that is greater than or equal to 200 that are further embedded in a polymer matrix film dielectric for providing intermittent bursts of high power output over the range of 0 to 10,000 volts, wherein an operation rating of the second energy source is within a temperature range between −50° C. and 330° C. while exhibiting a leakage current less than 1 amp per liter of volume over the range of operating temperatures and at a voltage up to 10,000 volts, wherein at least one of said outer layers comprises means for interconnecting a plurality of components mounted thereupon.

In embodiments, the device is an energy storage system as described herein, which system is integrated into a larger device such as an electric vehicle or gasoline/electric hybrid vehicle. In some such embodiments, the energy storage system comprises a capacitor as herein and the capacitor is hybridized with battery cells to achieve both high energy density and high powder densities.

In an aspect, there is a bulk material for RF applications such as miniaturized antennas, wherein the material volume is made of a nanocomposite comprising carbon nanodomains dispersed within a ceramic matrix material, the carbon nanodomains comprising graphene as single layers or stacks of 2-4 layers; wherein the volume and distribution of carbon nanodomains provide a permittivity of the nanocomposite that is greater than or equal to 200; wherein the nanocomposite is further embedded in a polymer matrix dielectric in the form of a film or bulk material, wherein additional voids are created in said polymer matrix dielectric to form an overall porous material, and wherein said voids are filled with a second material in a gaseous phase thereby providing the material with a permittivity in the range of 9 to 100. Example gaseous materials are air, nitrogen, or argon.

In an embodiment, the electronic device is an antenna, such as an RF antenna or a microwave antenna (e.g., a dielectric resonator antenna). The nanocomposite described herein has a high permittivity which allows for the production of smaller antennas for any given volume of nanocomposite. For example, in a DRA configuration, a block of the dielectric material disclosed herein (e.g., the nanocomposite, or the two-phase composite) is mounted on a metal ground plane. Other configurations for antennas are known and suitable. As applied in antenna configurations, it is desirable to use carbon nanodomains comprising graphene in stacks of more than 4 sheets (e.g., 4-12 sheet stacks as described herein).

In an aspect, a high permittivity material can be used in integrated circuits including very large systems in two areas. These are in the gate dielectric of a field-effect transistor (FET) and in capacitors with large capacitance. An example FET design can be found in US Patent Publication Number 2011/0147723. As the transistor in an integrated circuit is scaled down in size to fit more circuits per area, all of its dimensions should scale together for the electrical characteristics of the scaled transistor to remain similar to the unscaled version. When a dimension becomes smaller or comparable to a nanometer, scaling fails because quantum mechanical effects, which can be ignored at larger dimensions, become important. The gate dielectric in a metal-oxide-semiconductor field-effect transistor (MOSFET) becomes thinner as the transistor is scaled down in size. At a thickness of a nanometer or less, current begins to flow through the dielectric due to quantum mechanical tunneling of electrons and the properties of the transistor begin to deteriorate due to the leakage current. Since it is the ratio of the permittivity to the thickness of the gate dielectric that matters, scaling the permittivity up would have the same effect as scaling the thickness down but without the leakage current.

Capacitors with large capacitance require either a large area or a thin dielectric. A high permittivity dielectric—i.e., the dielectric material disclosed herein—allows small area and robust capacitors with large capacitance to be made in integrated circuits.

The above electronic devices are enhanced over previous electronic devices due to the use of the nanocomposites described herein. The nanocomposites allow high effective volumetric energy density (in the range of 500 to 600 Wh/L and effective gravametric energy density in the range of 200 to 250 Wh/kg. Furthermore, the nanocomposites are thermally stable over a wide temperature range, allowing operation of the electronic devices under inhospitable conditions (e.g., below −50° C. and above 100° C.). Furthermore, the above electronic devices are enhanced due to the high permittivity (greater than 200 as described herein) of the nanocomposite, which material includes a very high carbon content (greater than 5% as described herein). In embodiments the carbon content is greater than previous materials (e.g., greater than 15%) yet the nanocomposites remain non-conducting due to the configuration and/or presence of the carbon nanodomains, the ceramic matrix, the second phase, etc. In embodiments, the carbon nanodomains are highly conductive and are loaded within the ceramic matrix near (but below) the electrical conduction threshold. The carbon nanodomains are grown in situ and are therefore highly homogeneously distributed. The synthetic methods described herein provide control (e.g., via temperature variations, starting materials, etc.) over the carbon content, graphene layer stacking (i.e., number of graphene sheets per stack on average), and other factors.

The invention encompasses all combinations of recited particular and preferred embodiments. It is understood that the examples and embodiments described herein are for illustrative purposes only and that various modifications or changes in light thereof will be suggested to persons skilled in the art and are to be included within the spirit and purview of this application and scope of the appended claims. All publications, patents, and patent applications cited herein, including citations therein, are hereby incorporated by reference in their entirety for all purposes.

EXAMPLES

Capacitors can be evaluated by measuring the voltage across the capacitor as a function of time after a current source begins injecting a fixed current $I_o$ into the capacitor at t=0. The voltage across an ideal capacitor will linearly increase with time starting with zero voltage at t=0. The rate of voltage increase is inversely proportional to the value of the capacitance. If there is a parallel resistance $R_p$ across the capacitance, the voltage will saturate at a value of $I_oR_p$ after a time related to the time constant $R_pC$. If there is a series resistance $R_s$, the voltage at t=0 will be $I_oR_s$ rather than zero. With both a parallel and series resistance, the voltage will be $I_oR_s$ at t=0 and reach a saturation value of $I_o$ $(R_s+R_p)$ in a time related to $R_pC$. Thus, the capacitance, parallel resistance and series resistance can all be determined by this method. Instead of quoting the values of these circuit elements, it is more useful to quote the capacitance relative to an air capacitor of the same dimensions, the $R_pC$ time constant and the fraction of the voltage drop that occurs across the capacitance $R_p/(R_s+R_p)$ because these are not depend on the sample dimensions. The time constant is a measure of how long the capacitor can store a charge and the fraction of the voltage drop across the capacitor indicates the fraction of energy is stored in the capacitor rather than dissipated by $R_s$.

Samples based on the nanocomposites discussed herein which consist of a 1:1 volume fraction of the nanocomposite powder embedded in a polymeric host (PVDF) were measured, and results show relative high dielectric constants up to $1E^7$ or greater, which are varied by the content of the carbon nano domain and the maximum temperature of their development. The bulk nanocomposite itself shows varied permittivity levels of up to $1E^{10}$. The time constant is a few seconds and the fraction of voltage drop across the capacitance is a few percent. The short time constant and small voltage drop across the capacitor indicate that the series resistance is large and the parallel resistance is small. Further experimental details are provided below. It also indicates, that changes in the ceramic component of the nanocomposite and/or their particle size and shape, will provide additional effects on other desired parameters of the dielectric material performance.

Example 1. Synthesis of Cured Precursor with Low Content of Carbon Nanodomains A mixture of 20 g Polyhydridomethylsiloxane (PHMS), purchased from Gelest, USA) were mixed with 1.0 g (5 wt %) Vinylmethyltetracyclomer, purchased from Gelest, was prepared without any additional solvent. An amount of 0.17 g of $5.89 \times 10^{-2}$ wt % solution of Pt-cyclovinylmethylsiloxane catalyst (purchased from Gelest) in xylene was added to the mixture (5 ppm relative to PHMS). The low viscosity mixture was placed in a flat glass dish forming a 3 mm thick layer and it was covered to eliminate excessive incorporation of oxygen into the cured material via a side reaction of dehydrocoupling with moisture. Alternatively, covering of the dish prevents the volatilization of low molecular weight crosslinkers, such as the divinylbenzene used in this series.

The cast solution was allowed to stand overnight at RT until complete gelation was observed. The curing can be accelerated at 40° C. The cured material is a hard and brittle rubbery material having very high transparency. After the room temperature curing the specimens were heated gradually to 120° C. in dry air and kept at this temperature overnight for completion of curing. The cured material was either broken to pieces with convenient size for the pyrolysis step or crushed by a blender to form first powder before the pyrolysis step.

This material served as the comparative precursor to SiOC with relatively low excess of carbon. However, even in this case the calculated content of "free carbon" or the carbon nanodomains is 16 wt %, which means 18 vol % if we assume that the specific densities of graphene and the ceramic host ($SiOC_{0.5}$) at 1000° C. are assumed to be 2.0 g/cc and 2.3 g/cc, respectively and all the unaccounted carbon is assumed to be in the form of a fully developed graphene structure. The density values can be varied based on the structural status of the carbon nanodomains and the composition/temperature heating history of the amorphous SiOC component.

Example 2. Synthesis of Cured Precursor with Variable Content of Excessive Carbon Nanodomains by Reacting PHMS with Various Fractions of Divinylbenzene (DVB)

The Platinum catalyst (added at 5 to 10 ppm relative to PHMS) and various quantities of divinylbenzene were mixed first together and then added to the polymer. Divinylbenzene (DVB) amounts of 20, 30 40, 50 and 60 wt % relative the amount of the polymer (PHMS) were used (approximately 9, 24, 18, 23, and 28 mol % of DVB relative to the Si—H functional groups, respectively). The rest of the procedure was carried out as described in Example 1. After RT gelation all the cured products are hard rubbery materials with reduced level of brittleness as the level of DVB increases. The materials are glassy and highly transparent. They were either cut with a sharp knife to smaller pieces or crushed to powders with a blender.

Example 3. Pyrolysis of Cured PHMS-Based Polymers

The various cured polymers were pyrolyzed in a form of pieces or powders in Argon in a tube furnace, equipped with alumina tube. A standard heating rate of 5° C./min was used and the furnace was kept at the maximum intended temperature for 1 hour before cooling down by shutting off the furnace. The pyrolysis was typically completed at 1000° C. when some of the material was removed and the rest was reheated to 1450° C. The ceramic retention yields after heating at 1000° C. were in the range of 75 to 85 wt %. During the heating of the material from 1000° C. to 1450° C. at 5° C./min, the graphene or graphene-like domains (already detected to possess D and G bands accounted for distorted graphene structures by Raman Spectroscopy at 1000° C. but remained as single to 4 stacked layers as they were not observed by TEM) were rearranged to form stacks of graphene layers (previously defined as "turbostratic carbon") that were detected by TEM and according to calculations based on Raman spectroscopy maintained their lateral dimensions at the range of 2 nm. According to TEM the lateral dimension seemed to be 5 to 10 nm. However, it is not ruled out that the larger visual dimensions are due to a combination of several graphene domains together in each of the observed layers.

The derived nanocomposites consisting of carbon nanodomains embedded in a ceramic host matrix at the dimension scale of 10° to $10^1$ nm and obtained after pyrolysis at 1000° C. contained increasing levels of graphene and graphene like structures in direct correlation to the amount of DVB added to the reaction. Based on similar calculations described in example 1, the estimated vol % of the graphene domains are in the range of 26 vol % and 38 vol % for the reactions containing 20 wt % and 60 wt % of DVB, respectively, when a specific density of 2.0 g/cc was assigned to both the assumed graphene content and to the amorphous SiOC structure.

The vol % was measured based on elemental analyses and the following assumptions: All the oxygen is firstly assigned to the silicon as in "$SiO_2$" all the remaining silicon atoms is associated with carbon in the composition of "SiC". The remaining carbon atoms are assumed to constitute the "free carbon" phase and assigned to the graphene and graphene-like fraction. However, it is possible that some of the carbon is still trapped as small molecular clusters that do not constitute yet a full graphene structure. The "free carbon" wt % is then converted to their volumetric fraction. The information about the densities of the elements in such amorphous materials are scattered and highly dependent on the composition and the maximum temperature they were taken to. Values between 1.8 to 2.2 g/cc are reported for graphene and values between 1.9 to 2.35 g/cc for SiOC.

Current scientific understanding of such materials does not have a better technique to estimate the exact nature of all the carbon nanodomains and their exact vol %.

Example 4. Pyrolysis of Methylsisesquixane for Forming SiOC with Relatively Low Content Carbon Nanodomains The amount of 10 g of methylsilsequioxane, commercially available from Gelest, Wacker and other sources is pyrolyzed under the same conditions described in Example 3.

Example 5. Pyrolysis of a Homogeneous Blend of Methylsisesquixane and Phenylsilsesquioxane for Forming SiOC with High Content Carbon Nanodomains A mixture of 7 g of methylsilsequioxane and 4 g of phenyl silsesquioxane, commercially available from Gelest, Wacker and other sources are homogeneously blended in 50 g of toluene and the solvent is removed by vacuum while the mixture is rotated. The dry mixture is pyrolyzed under the same conditions described in Example 3.

Example 6. Pyrolysis of Blended Phenylsilsequioxane and Polymethylsilazane for Forming SiOCN with High Content Carbon Nanodomains A mixture of 8 g of polymethylsilazane (e.g., a Ceraset like polymer) and 4 g of phenyl silsesquioxane, are homogeneously blended in 50 g of THF. An amount of 0.3 g of water is added and the solution is aged at room temperature overnight. The solvent is removed by vacuum while the mixture is rotated. The dry mixture is pyrolyzed under the same conditions described in Example 3.

Example 7. Synthesis of SiOC Precursors with High Carbon Nanodomain Content Via Sol Gel Technique (a) Hydrosilylation Step. Divinyl benzene (DVB) was dried overnight over molecular sieves. Toluene was dried over $CaH_2$ in a plastic container overnight, while initially the hydrogen gas was frequently released from the container. An amount of 8.2 g (50 mmol) of Triethoxyhydrosilane, (EtO)$_3$SiH (THES, Gelest's SIT8185.0, BP 132° C.), were placed in a 100 ml 3 neck flask equipped with a condenser with a $CaCl_2$ trap on top. The liquid in the flask was magnetically stirred in a water bath at 50-55° C. 3.25 g of DVB (25 mmol) were mixed with 10 g of toluene in a dripping funnel attached to the 3 neck flask. Acetic acid (0.1 ml) was added to the flask and then premeasured 0.4 g of $5\times10^{-4}$ wt % of Pt catalyst (Pt divinyltetramethyldisiloxane catalyst) was added to catalyse the hydrosilylation reaction. As soon as the Pt was added, the DVB solution was introduced by dripping into the flask. The solution dripping continued for 1 h until fully consumed. The solution was homogeneous with a slight grayish color. After 5 h about 50% of the vinyl groups have been consumed as estimated by NMR analysis. Another aliquot of 0.24 g of the Pt solution was added and the reaction continued for 5 more hours. An estimated 65% of the vinyl groups were consumed according to NMR. The operation was kept overnight for additional 10 h reaction before cooling the flask. No visual change were observed in the reaction solution.

(b) Hydrolysis-condensation step. In this case the plan was to make the precursor in a form of powder. A solution of 120 ml of 5% $NH_4OH$ in water was magnetically stirred in a conical flask, while the hydrosilylation reaction solution was dripped slowly from a dripping funnel. The water solution started to be hazy as soon as the organic hydrosilylation solution made in step (a) was added. After about 1 ml of solution dripping most of the spontaneous precipitation remained at the surface due to hydrophobicity. An amount of 120 g of ethanol was added to homogenize the solution in the conical flask and the dripping continued. All the hydrosilylation solution was added in 5 min. The stirring continued for an additional 1 h. The solution with the powder was centrifuged and washed-centrifuged first with 50/50 ethanol/water and then with 95% ethanol. The washed powder was dried overnight at 60° C. in a vacuum oven. The powder yield was 1 g. It means that a significant amount of the intermediate did no precipitate. The powder was analyzed by TGA, particle analysis and bulk pyrolysis.

Example 8. Modified Synthesis of Precursor Via Sol Gel Reaction (a) Hydrosilylation step. Divinyl benzene (DVB) was not dried this time and toluene was not added as a solvent. An amount of 16.4 g (100 mmol) triethoxyhydrosilane (THES, Gelest's SIT8185.0) was placed in a 100 ml 3 neck flask equipped with a condenser with a $CaCl_2$ trap on top. The liquid in the flask was magnetically stirred in a water bath at 50-55° C. An amount of 3.25 g of DVB (25 mmol) was placed in a dripping funnel attached to the 3 neck flask. Acetic acid (0.1 ml) was added to the flask. A few drops of the DVB were introduced to the reaction solution and then a premeasured amount of 0.4 g of $5\times10^{-4}$ wt % of Pt catalyst (Pt divinyltetramethyldisiloxane catalyst) was added. As soon as the Pt was added, the DVB solution was let dripping into the flask in a very slow pace. The dripping of all the DVB was completed in about 1 h. The solution is homogeneous and clear with no grayish coloration this time.

After 4 h of reaction an NMR spectrum indicated the consumption of all the DVB (no earlier sampling was taken). An additional aliquot of 0.24 g of the Pt solution was added after adding a few drops of DVB to the reaction solution. Then, an amount of 1.70 g of DVB was added drop-wise in 20 min. The NMR spectrum after 2 hours revealed the complete consumption of the DVB and further reduction of the Si—H group. Additional amounts of 1.85 g of DVB and 0.25 g of Pt solution were added as above (the next morning). NMR spectrum after 4 hours of reaction revealed that over 95% of the Si—H groups were consumed.

(b) Hydrolysis-condensation step. 80 g of ethanol (95%) were added to the reaction vessel while rapidly stirring the solution with a magnetic stir bar. The solution became almost immediately hazy. Then, a mixture of 10 g of 30% ammonium hydroxide and 10 g of 95% ethanol were slowly added to the stirred solution. Significant precipitation was observed. The white powder remained suspended in the solution (at least for an hour). Additional amount of 10 g of 30% ammonium hydroxide was added and the evolved slurry was stirred overnight. The solution with the powder was centrifuged and washed-centrifuged first with 50/50 ethanol/water and then with 95% ethanol. The washed powder was dried overnight at 60° C. in a vacuum oven. The powder yield was 7.1 g. The theoretical yield should be 11.8 g, suggesting that significant amount of the reaction products are still soluble or colloidally dispersed in the solvent phase.

The dried powder was ball milled but it was too "wet" or sticky and formed small lumps. Therefore, it was further cured at 200° C. A slight discoloration has been observed. The weight loss during this stage was 14.9%. The powder was then ball milled for 3 h, providing very fine and non-sticky powder. The powder was analyzed by TGA. The ceramic yield was 50.5% without further curing to condense the residual Si—OH (i.e., significant weight loss during such condensation at temperature below 300° C.

Example 9. Example 8 with Addition of 1 Molar Equivalent of TEOS to Reduce the Carbon Nanodomain Fraction The procedure of Example 8 was repeated with adding 1 mol equivalent of tetraethoxysilane (TEOS, a silica precursor) to the product obtained from the reaction triethoxyhydrosilane plus DVB (the hydrosilylation step) in order to reduce the post pyrolysis amount of free carbon and consequently reduce the conductivity of the material.

(a) Hydrosilylation step. This step was performed similarly to the same step in example 8, following the disappearance of the Si—H bond by NMR. amount of the triethoxyhydrosilane was 16.4 g (100 mmol).

(b) Hydrolysis-condensation step. 80 g of ethanol (100%) were added to the reaction vessel while rapidly stirring the solution with a magnetic stir bar. Then, 10.4 g (50 mmol) of TEOS were added. Then, a mixture of 10 g of 30% ammonium hydroxide and 10 g of 95% ethanol were slowly added to the vigorously stirred solution. Significant precipitation was observed. The white powder remained suspended in the solution (at least for an hour). Additional amount of 10 g of 30% ammonium hydroxide was added and the evolved slurry was stirred overnight. The solution with the powder was centrifuged and washed-centrifuged first with 50/50 ethanol/water and then with 95% ethanol. The washed powder was dried overnight at 60° C. in a vacuum oven.

Example 10. Example 9 with Addition of 2 Molar Equivalents TEOS to Further Reduce the Carbon Nanodomain Fraction The procedure of Example 9 was repeated with adding 2 mol equivalent of tetraethoxysilane (TEOS, a silica precursor) to the product obtained from triethoxyhydrosilane plus DVB in order to further reduce the amount of free carbon and consequently reduce the conductivity of the material. The amount of added TEOS was 20.8 g (100 mmol).

Example 11. Reaction Between 1 Molar Equivalent of Phenyltrietoxysilane with 2 Molar Equivalents of TEOS The reaction is carried out in a similar manner to the hydrolysis condensation step in examples 8 in order to obtain a composition with approximately 25 mol % of phenyl groups bonded to the gel network, which provide high free carbon content during the pyrolysis due to the presence of the aromatic rings and the overall high carbon content.

Example 12. Reaction Between 1 Molar Equivalent of Phenyltrimethoxysilane with 3 Molar Equivalents of Methytriethoxysilane The reaction is carried out in a similar manner to the hydrolysis condensation step in examples 8 in order to obtain a composition with approximately 25 mol % of phenyl groups bonded to the gel network, which still provides high free carbon content during the pyrolysis due to the presence of the aromatic rings and the overall high carbon content. The methyl groups from the methyltriethoxysilane are partially incorporated into the SiOC network, partially converted to carbon domains and partially evolved as methane gas.

Example 13. Example 8 with Addition of 2 Molar Equivalents TEOS and 1 Molar Equivalent of B(OH)$_3$ The borosiloxane gels can be synthesized by homogeneously mixing 1 molar equivalent of the hydrosilylation product of example 8 with 2 molar equivalents of TEOS and 0.5 molar equivalent of boric acid (B(OH)$_3$ in 3 molar equivalents of dry ethanol. A solution of 1 molar equivalent of ethanol containing water in the amount of 1 molar equivalent to the ethoxy groups is then added and homogeneously mixed into the solution. A few drops of HCl are added to obtain pH 1. The solution is aged overnight at elevated temperature such as 50° C. and then cooled to room temperature and cast in a container allowing slow evaporation of the solvent. A gel is formed which can be further dried by heating to 150° C., while the gel volume is shrinking. Then the mixture is ready for pyrolysis.

Similar procedures can be made with other carbon generating reagents such as vinylethoxysilane and phenylethoxysilane. Also, if the acid catalyst is replaced by a base catalyst or if after the initial acidic catalyzed reaction the solution pH is converted to be basic by adding for example ammonium hydroxide, then the gel product can be directly formed in a powder form.

Example 14. Example 8 with Addition of 2 Molar Equivalents TEOS and Additional Amount of Al(iPrO)$_3$ The procedure of example 13 can be performed with Al(iPrO)$_3$ as an aluminum oxide source instead of the boron oxide source. The aluminum oxide content may improve the insulating characteristics of the final product. The Al reagent can be co-hydrolyzed and condensed with the rest of the reagents or added after precipitation of particles in basic solution that is then neutralized. Then the alkoxy aluminum can be added in lower molar equivalents (for example 0.1 molar equivalent) to form in-situ a passivating alumina film around the particles.

Example 15. Examples 8 to 14 Wherein the Polymerization Leads to the Formation of Bulk Gels While example 9 was planned to generate directly powders, in this example acidic conditions (e.g. HCl or acetic acid) are used during the hydrolysis-condensation step in order to form a bulk gel instead of the powder. Such techniques are preferable in case that a monolithic nanocomposite is desired or if films of the nanocomposite are desired and deposited by wet techniques such as spinning or dipping. This approach is also suitable for forming very fine particles by aerosol spay techniques.

Example 16. Spray Pyrolysis of Examples 8 to 14 Solutions

The mixed solutions prepared for the hydrolysis condensation of examples 8 to 14 are kept neutral and homogeneous at low concentrations. The solutions are then converted to pyrolyzed nanocomposite fine particles by various spray pyrolysis techniques.

Example 17. Thin Film Formation

The solutions described in example 15 are kept homogeneously in solution, which is then deposited as submicron films by various wet deposition techniques. The coated materials are then gelled in humid condition followed by heating to 1000° C. or above to form a nanocomposite thin film.

Example 18. Thin Film Deposition by MOCVD

A mixture of volatile alkoxy or chlorosilicon reagents comprising carbon forming groups such as phenyl or vinyl with or without additional volatile reagents of other elements such as trialkyl aluminum or boranes are kept homogeneously in solution, which is then deposited as submicron films of the nanocomposite with carbon nanodomains by various MOCVD techniques. In this case the formation of graphene domains may be achieved at lower temperatures than 1000° C. if for example plasma assisted or radiative processes are used.

Example 19. Thin Film Deposition by Sputtering

Another technique to achieve low temperature deposition of ceramics with free nanocarbon domains is to use such a pyrolyzed material as targets for sputtering techniques. Alternatively, such nanocomposites may be formed by using 2 separated sources of targets one for the ceramic and one for the carbon components in the nanocomposite.

Example 20. Formation of a Nanocomposite Plate from Crosslinked Polymers

Nanocomposite plates containing high content of carbon nanodomains can be obtained by slow sol-gel and drying techniques including the use of supercritical drying to avoid stresses and consequent cracking of the formed bulk materials.

They can be also made from crosslinked polymers. However, the last ones are very fragile due to the stresses generated by the gas evolution during the pyrolysis and the significant shrinkage of the polymer derived material. One way to avoid such stresses is to process powders of cured polymers. The powders are then mixed with small amount of uncured polymer as a binder, which is then cured under pressing conditions. Now the bulk sample can be removed from the press and gently pyrolyzed.

Example 21. Formation of a Ceramic Structure from Pyrolyzed Nanocomposite Powders An alternative method to form bulk structures is to take pyrolyzed powders of the nanocopmosites and add the same or similar uncured precursor as a binder; then press the samples in a mold while curing the binder at elevated temperature such as 100 to 150° C. Then, the samples are pyrolyzed. Additional polymer can be infiltrated into the structure in order to reduce the porosity of the final structure. The curing-pyrolysis procedures are followed after each infiltration.

Example 22. Formation of a Ceramic Structure by Sintering the Nanocomposite Powders Another alternative method for making bulk nanocomposite is to take pyrolyzed nanocomposite powders and sinter them by hot press, hot isostatic press, or field assisted sintering. In these cases it is important to maintain the sintering temperatures at below 1400° C. or preferably below 1200° C. to avoid rearrangement of the graphene domains or induce carbothermal reduction.

Example 23. Formation of a Bulk Structure by Hot Pressing Nanocomposite Powders with a Low Melting Point Glass Phase An alternative technique to obtain a complete inorganic nanocomposite is to mix homogeneously a small amount of glass formulation that has softening point below 1200° C. and then sinter the composition with or without aid of pressure. This is a similar case to the blending with polymers as a second phase added to the nanocomposite powder as the first phase.

Example 24. Further Processing of Pyrolyzed Material to Form Processable Nanocomposite Powders The pyrolyzed nanocomposite materials synthesized according to examples 1, 2 and 7 to 9 and pyrolyzed according to examples 3 to 6 were grinded first with a mortar and pestle and them ball milled for about a week in organic solvents and zirconia balls. In some cases the pyrolyzed material was already in a form of agglomerated powder as it was ground prior to the pyrolysis or synthesized into a powder from. However, even in these cases there was a need to further grid and ball mill the pyrolyzed material. The form powders were then passed through a 400 mesh sieve. The portion that does not pass was ground and ball milled again.

Example 25. Partial Oxidation of Pyrolyzed Powder

Some batches of pyrolyzed powders were also reheated in air in a furnace already heated at 1000° C. for durations of 2 to 10 minutes in order to oxidize their surfaces and consequently achieve higher electrical resistance by removing any excess of carbon material deposited at the surface.

For example, a sample of material derived from PHMS plus 50 wt % DVB and pyrolyzed at 1000° C. in argon was reheated in an open box furnace at 1000° C. for 10 minutes and then removed and cooled quickly to room temperature in the air. The first samples came out glowing with a bluish glow, but remained black in color. There was 5% weight loss. In another case a pyrolyzed material made of PHMS and 40 wt % DBV was place in a closed tube furnace and rapidly heated to 1000° C. under argon flow. The atmosphere of the furnace was switched to air at 2 L/min and the sample was dwelled at 1000° C. for 10 minutes with the air flow. The air flow was stopped and the glass tube was flushed with argon and allowed to cool to room temperature overnight. This material showed no sight of white powder or sintering activity. There was a weight loss of 2.5 wt %.

Example 26. Preparation of Polymer Composite Plates for Assessing the Permittivity, Resistivity and Loss of the Nanocomposites Most of the test samples were prepared in the form of 1"×1" thin squares made of the nanocomposite powders and a polymer (polyvenylidene difluoride, PVDF), which were then coated with gold or gold titanium at their two flat sides to provide uniform electrodes and allow testing the samples in the form of a layered capacitor. Most samples had 1/1 vol/vol mixture of powder/PVDF (1/0.89 by weight). For 6 g of nanocomposite powder 5.34 g of PVDF were used.

The PVDF was first heated with stirring to 90° C. in a flask with 6.2 g of DMF and 6.2 g of MEK. This mixture was held at 90° C. for 1 h with fairly rapid stirring to get the PVDF to completely dissolve the polymer. The ball milled nanocomposite powder was then added and stirred for an additional half hour. It was then sonicated for 0.5 h in a sonicating water bath at about 60° C. It was then reheated to 90° C. and stirred for another 0.5 h to insure a completely homogeneous mixture. It was then poured into an evaporating dish and stirred gently as it was cooling to ensure that there was no settling of the powder and the mixture. The stirring was continued until the slurry became very viscous and sticky due to evaporation of solvents. The stirring was stopped when the slurry became too thick to stir without incorporation of air bubbles. The residual solvent was finally removed by heating in a vacuum oven at 100° C. for 4 h.

The polymer composite was then softened at 200° C. and folded several times to ensure the uniformity. Portions of the mixtures were then placed in a mold, reheated to 200° C. in a 20 min period while the pressuring screws of the mold were gradually tightened. The mold was allowed to cool and opened. The formed plates were removed from the mold. Excess material was cut away from the edges and any roughness on the edges was sanded off with 1200 grit sanding paper.

Example 27. Preparation of Tubes for Assessing the Permittivity in a Large Range of RF A stainless steel cylindrical die was made, equipped with a cylindrical hole for measuring the temperature with a thermocouple. The cavity dimensions were 7.2 mm diameter and 4 cm long. Harden stainless steel rods that have relatively loose tolerance inside the hole were used as plungers and other small cylinders (height=0.5 mm) were used as the bottom plugs and spacers to adjust the height of the composite rods. The die cavity was filled with the polymer composite gross particles, which were cold-pressed gently. Then, the mold was heated to 170° C. and held for ½ h at this temperature. The powder was then pressed gently and more composite material was added, until the total amount of composite was around 2.5 g. The die was reheated to 170° C. and then placed in a preheated press at 170° C. It was gently pressed keeping the pressure at 500 psi. The heated plates were turned off after 15 min. Once the temperature dropped down to 100° C. the pressure was released and the die was removed from the press for faster cooling. When reaching 40° C., the rods were pressed out of the cylindrical cavity.

Finally, the rods were precision machined to match with minimum gap a standard 7 mm air-line for testing using a vector network analyzer and the material loaded coaxial air-line to characterize the material by a number of linear two-port network equivalent circuit parameters, such as their transfer matrix.

Example 28. Formulations Prepared for Forming Capacitor Plates and Antenna Tubes for Testing Table 1 contains formulations that were used to make the above described rods and thin plates. Composites made of commercial calcium copper titanate (CCTO) nanopowder was used as a comparative sample in tests. CCTO is considered to be the state of the art high permittivity material, with reported permittivity values of 10,000 to 250,000. In this series the nanocomposite materials were pyrolyzed at 1000° C. and further heated to 1450 in a bulk form. Only after pyrolysis or heat treatment at 1450° C. the materials were grinded and ball milled.

TABLE 1

| # | Source for SiOC powder | Pyrolysis temperature (° C.) | Vol ratio with PVDF | Weight of SiOC (g) | Weight of PVDF (g) | Weight of DMF (g) | Weight of MEK (g) |
|---|---|---|---|---|---|---|---|
| ANT1 | PHMS-DVB60 | 1000 | 1:1 | | | | |
| ANT2 | PHMS-DVB60 | 1450 | 1:1 | 11.2 | 9.9 | 11.6 | 11.6 |
| ANT3 | PHMS-DVB30 | 1000 | 1:1 | 8.5 | 7.6 | 8.8 | 8.8 |
| ANT4 | PHMS-DVB30 | 1450 | 1:1 | 8.5 | 7.6 | 8.8 | 8.8 |
| ANT5 | PHMS-TVTMC5 | 1000 | 1:1 | 8.5 | 7.5 | 8.8 | 8.8 |
| ANT6 | PHMS-TVTMC5 | 1450 | 1:1 | 8.5 | 7.5 | 8.7 | 8.8 |
| ANT7 | CCTO Powder | Comparison Sample 1 | 1:1 | 14.8 | 5.2 | 6.1 | 6.1 |
| ANT8 | NO Powder | Comparison Sample 2 | 100% | | | | |
| ANT11 | PHMS-DVB60 | 1450 | 1:1 | 14.8 | 13.2 | 20.4 | 15.0 |

Example 29. Formulations Prepared for Forming Capacitor Plates for Testing

The following table contains formulations that were used to form thin plates for capacitor testing. In this series the materials were grinded to powder after curing and before the pyrolysis. Additional grinding and ball milling was performed after pyrolysis.

TABLE 2

| # | SiOC powder | Pyrolysis/heating temp. (° C.) | Vol ratio with PVDF | Weight of SiOC (parts) | Weight of PVDF (parts) | Weight of DMF (parts) | Weight of MEK (parts) |
|---|---|---|---|---|---|---|---|
| GRA1 | PHMS-DVB60 | 1450 | 0.5/0.5 | 1.00 | 0.89 | 1.04 | 1.04 |
| GRA2 | PHMS-DVB60 | 1450 | 0.4/0.6 | 1.00 | 1.34 | 1.56 | 1.56 |
| GRA3 | PHMS-DVB60 | 1000 | 0.5/0.5 | 1.00 | 0.89 | 1.04 | 1.04 |
| GRA4 | PHMS-DVB50 | 1000 | 0.5/0.5 | 1.00 | 0.89 | 1.04 | 1.04 |
| GRA5 | PHMS-DVB50 | 1450 | 0.5/0.5 | 1.00 | 0.89 | 1.04 | 1.04 |
| GRA6 | PHMS-DVB50 oxidized | 1000 | 0.5/0.5 | | | | |
| GRA7 | PHMS-DVB40 | 1000 | 50/50 | | | | |
| GRA8 | PHMS-DVB40 | 1450 | 50/50 | | | | |
| GRA9 | PHMS-DVB40 Oxidized | 1000 | 50/50 | | | | |
| GRA10 | PHMS-DVB30 old | 1000 | 50/50 | | | | |
| GRA11 | PHMS-DVB50 | 800° C. | 50/50 | | | | |

Example 30. Capacitance Meter Measurement

Capacitance Meter Principle. A capacitance meter applies an AC voltage (or current) of known frequency, amplitude and phase to the component under test, and then measures the amplitude and phase of the current (or voltage). It then takes the ratio of the measured quantity to the applied quantity to obtain either a complex admittance (I/V) or a complex impedance (V/I). Sweeping over a range of frequencies gives the admittance or impedance spectrum.

Often the user is not primarily interested in the spectrum but in the value of the component under test, for example, the capacitance of a capacitor or the inductance of an inductor. Since the measured quantity is an admittance or impedance spectrum, a circuit model is needed to relate the spectrum to the value of the components in the model. Usually, the model consists of several ideal circuit elements (resistor, capacitor and inductor) whose component values are frequency-independent. The complex admittance or impedance spectrum of the model is calculated and the component values are selected to give the best fit to the measured spectrum. Most capacitance meters have two built-in models—a capacitor with a series resistor and a capacitor with a parallel resistor—that the user can select. Since each model consists of only two parameters, a capacitance and a resistance, the amplitude and phase from a measurement at a single frequency can yield values for these two parameters.

How closely the fitted circuit parameters correspond to the underlying device physics and to the microscopic structure of the component under test will of course depend on the appropriateness of the model. For example, trying to fit an inductor to a capacitor with a series resistance will give numbers for the capacitance and series resistance but these numbers are not useful for inferring the number of turns in the inductor. Indications that the model is incorrect are unrealistic values for the fitted parameters (e.g., negative resistance) and strong frequency dependence of the fitted parameters. On the other hand, it does not help in understanding the device physics and the microstructure by adding more elements to the model to obtain a better fit.

Example 31. Testing and Analysis of Permittivity and Resistivity of Samples Prepared Square flat samples with approximate size of 1×1" and varied thicknesses between 0.1 to 2 mm were used for assessing the permittivity of the ceramic nanocomposites themselves (very fragile under currently used shape processing technique) or after the ceramic nanocomposites were mixed as powders with PVDF, mostly in a volume ratio of 1:1. The tested plate formulations are described in examples 26 and 27.

Before testing the samples, a titanium-gold or gold electrodes were deposited on each face of a sample. The depositions were either by electron beam evaporation or by sputtering with no difference between the two deposition methods. The edges of the samples (z direction) were sanded to make sure that no metal deposition was bridging between the two faces and short-circuiting the sample.

Each sample was measured by injecting a current $I_o$ from a current source starting at t=0 and monitoring the voltage as a function of time for t≥0. For an ideal capacitor of capacitance C, the voltage $V_1(t)$ will grow linearly with time as the current charges the capacitor: $V_1(t)=I_o t/C$ for t≥0. An ideal capacitor with a parallel resistance $R_p$ will change the response to $V_2(t)=I_o R_p[1-\exp(-t/\tau)]$ for t≥0 where the time constant $\tau=R_p C$. Note that $V_2(t)$ reduces to $V_1(t)$ when t<<τ. When a series resistance $R_s$ is added to the parallel $R_p$ and C combination, the voltage response becomes $V_3(t)=I_o R_s+$ $I_oR_p[1-\exp(-t/\tau)]$ for $t\geq 0$. The series resistance simply adds a constant ohmic voltage drop to the measured voltage. In principle, this time domain measurement gives exactly the same information as the better known frequency domain method since the two are related by a LaPlace transform. Due to practical considerations, it is easier to measure large capacitance by monitoring the voltage for a long time rather than by generating and monitoring very low frequencies.

could be characterized by a number of equivalent circuit parameters, such as their transfer matrix, impedance matrix, admittance matrix, and scattering matrix. The goal was to determine the complex dielectric permittivity of the sample materials from this data over temperature.

The electromagnetic parameters of the samples were retrieved using the line scattering coefficients (S-parameters), measured with a vector network analyzer in the

TABLE 3

| # | wt % DVB vs. PHMS | Max Temp (° C.); (Oxidation Conditions) | Vol % Polymer binder (PVDF) | Through thickness or Powder | Measured Resistivity (Ω) Surface 1 | Surface 2 | Resistivity (Ω) from model $R_p$ | $R_s$ | Permittivity $\varepsilon_r$ |
|---|---|---|---|---|---|---|---|---|---|
| ANT1 | 60 | 1000 | 50 | >3 × 10$^7$ | >3 × 10$^7$ | >3 × 10$^7$ | 7.9 × 10$^4$ | 9.6 × 10$^5$ | 3.1 × 10$^7$ |
| ANT2 | 60 | 1450 | 50 | 5 × 10$^3$ | 1.7 × 10$^4$ | 2 × 10$^3$ | — | — | — |
| GRA1 | 60 | 1450 | 50 | 1.2 × 10$^3$ | 9 × 10$^2$ | 5 × 10$^2$ | | 2 | short |
| GRA2 | 60 | 1450 | 60 | 3 × 10$^3$ | 7 × 10$^3$ | 4 × 10$^3$ | | 2 | short |
| GRA3 | 60 | 1000 | 50 | 1.6 × 10$^6$ | 1.3 × 10$^6$ | 1.1 × 10$^6$ | — | 6.5 × 10$^2$ | Short? |
| GRA4 | 50 | 1000 | 50 | >3 × 10$^7$ | >3 × 10$^7$ | >3 × 10$^7$ | 2.9 × 10$^4$ | 1.4 × 10$^6$ | 2.4 × 10$^7$ |
| GRA6 (partially oxidized powder) | 50 | 1000 (oxidized for 10 min at 1000) | 50 | >3 × 10$^7$ | >3 × 10$^7$ | >3 × 10$^7$ | ~10$^8$ | 1.5 × 10$^9$ | ~10$^3$ |
| GRA7 | 40 | 1000 | 50 | >3 × 10$^7$ | >3 × 10$^7$ | >3 × 10$^7$ | Short? | — | — |
| GRA8 | 40 | 1450 | 50 | — | 3 × 10$^3$ | — | — | — | — |
| Ceramic plate from material used to make ANT2 | 60 | 1450 | none | — | — | — | 2.3 × 10$^3$ | 2.4 × 10$^4$ | 7.4 × 10$^9$ |

The measurements were done using a Hewlett-Packard 4145B Parameter Analyzer configured to turn on a current source while measuring and digitizing the voltage. Each data point consisted of the time since the current source was turned on and the voltage at that time. Between 100 and 1000 data points uniformly spaced in time and extending until the voltage was within a few percent of its asymptotic value formed a data set. The data set was uploaded to a computer that did a three parameter ($V_3(0)$, $V_3(\infty)$ and $\tau$) nonlinear fit of the data to $V_3(t)$ with the widely used Nelder-Mead simplex algorithm. From these fitting parameters and the current $I_o$, we can determine C, $R_p$ and $R_s$. The fits are generally very good, indicating that the sample behaves in a circuit as a capacitor of value C with a parallel resistance of value $R_p$ and a series resistance of value $R_s$.

Data for samples tested by this technique and analyzed by fitting model are presented in Table 3. The table includes also resistivity measurements that were taken directly on various samples including samples that were not tested by the model.

Example 32. Evaluation of RF Response for Polymer Composites as Materials for Antennas Selected materials from the table in example 28 were tested as potential RF materials with the goals of achieving both low mass density and enhanced dielectric properties and utilizing these materials for Lightweight Dielectric Resonant Antenna for the UHF band. A well characterized commercial material from Transtech, (Skyworks) was used as a control (TRAMSTECH-8000 ceramic). Also, a 50 vol % CCTO in PVDF was used as a control as well as PVDF itself.

The materials were molded and machined to match to a standard coaxial air-line from Maury Microwave. The loaded coaxial air-line was a linear two-port network that frequency range 50 MHz to 20 GHz over temperature, using a HP8753ES Vector Network Analyzer and the output data was analyzed by the Matlab RF Toolbox using a Matlab Script incorporating the Boughriet method, which, for non-magnetic materials, optimizes the Nicolson-Ross-Weir (NRW) algorithm in order to accurately estimate the material complex permittivity in a wide frequency band. The equations given by the Boughriet method provided the values of the effective permittivity εeff as a function of the frequency.

It should be noted that at the lower frequencies and at frequencies multiple of the line half-wavelength resonances, the accuracy was significantly reduced. In particular, the accuracy gets worse for materials with high permittivity and low losses. Only first order attempts were made to eliminate the effect of wave resonances in the coaxial—air line. To speed up testing the higher order modes were not removed which results in the oscillations as the relative magnitudes but is suitable for our purposes. Nevertheless the average values for the permitivities in a given range of frequencies can be extracted.

The table below gives the εeff values for selected specimens from each formulation at the lowest measured frequency (50 MHz), which provided the highest permittivity value in several sets, intermediate frequency (250 MHz), where the permittivity values were close to their lowest values and at 500 MHz. Notice that in this case samples heated at 1450° C. provided a significantly higher RF response, in contrast to the measurements in example 30. In example 30 the ANT2 material with stacks of graphene were too conductive. Notice that the CCTO composite provided permittivity values are 2 orders of magnitude lower than ANT2. While the performance of the CCTO composite was constant regardless the frequency the performances of ANT2 and ANT4 increased exponentially as they reached lower and lower frequencies.

| # | SiOC powder/Pyrolysis Temp. (° C.)/1:1 vol PVDF | $\varepsilon_{\it eff}$ (50 MHz) | $\varepsilon_{\it eff}$ (250 MHz) | $\varepsilon_{\it eff}$ (500 MHz) |
|---|---|---|---|---|
| ANT1 | PHMS-DVB60/1000 | 35 | 35 | 36 |
| ANT2 | PHMS-DVB60/1450 | 2600 | 1050 | 500 |
| ANT3 | PHMS-DVB30/1000 | 1.6 | 1.6 | 2.0 |
| ANT4 | PHMS-DVB30/1450 | 470 | 250 | 155 |
| ANT5 | PHMS-TVTMC5/1000 | 1.2 | 1.4 | 1.8 |
| ANT6 | PHMS-TVTMC6/1450 | 1.6 | 2.0 | 2.1 |
| ANT7 | CCTO Powder | 16 | 16 | 18 |
| ANT8 | NO Powder | 1.0 | 1.0 | 0.9 |

No signficant change was noted over the tempertrue range of 0 to 50° C.

Example 33. Preparation of Capacitor with the Nanocomposite Dielectric Material

A capacitor is formed by placing a thin film of the polymeric composite, ANT1, in between 2 electrodes made of 50 μm aluminum foil. The desired thickness of the dielectric layer composite is 10 μm, which can be achieved using nanocomposite particles of less than 5 μm in diameter, slurry deposition of the mixed particles and polymer, e.g., PVDF, drying and melting the composition and finally calendaring the sandwiched layers to achieve the appropriate thickness of the dielectric layer.

The sandwiched layers can be incorporated with a 50 μm sheet of an insulating polymeric film and the two films can be rolled or folded to form a cylindrical or prismatic shaped capacitor.

Example 34. Multilayer Capacitor

A multilayer capacitor for energy storage device is prepared by using a copper foil as the base substrate and first electrode layer. Then, a slurry of GRA-4 formulation is deposited forming a 20 μm layer. A slurry consisting of a copper nanoparticles and a binder are then deposited as another electrode layer. The electrode area is not completely covering all sides of the dielectric film to obtain a non shorting device. The process is repeated multiple times between the dielectric and the electrode layers. The sides of the multilayer are processed to allow connectivities of each second metallic layer to each other. Such a high power storage capacitor can be used to form an integrated hybrid battery capacitor for mobile applications including electrical vehicles to provide high efficiency combination of high energy density, high power density, fast charging including harvesting of energy from braking and discharging on demand, while size and weight are reduced compared to current hybrid technologies based on current market supercapacitors and ultra capacitors.

Example 35. Embedded Distributed Capacitor

An embedded distributed capacitor is made as a part of a printed circuit board having a planar top outer layer; a planar bottom outer layer; and a planar capacitive core element deposited in parallel relation between said top outer layer and said bottom outer layer. The capacitive core element includes an electrically conductive ground plane and a dielectric plane deposited therebetween and the dielectric plane comprising a composition of a nanocomposite made of carbon nanodomains embedded in a ceramic insulating matrix that was heated at 1000° C. The volume and distribution of the carbon nanodomains in the nanocomposite provide a permittivity of that is greater than or equal to 200 after being mixed with 50 vol % polymer. This dielectric constant is 100 times or more greater than a dielectric constant of a conventional polymeric of $SiO_2$ electrically insulative material. Similar designs of such embedded capacitor planes can be processed in a multiple fashion and with varied dielectric characteristics to address all the printed circuit board needs. They can be then connected by an electrically conductive element. Similarly they can be interconnected with a plurality of components mounted to the printed circuit board.

Example 36. RF Material in RF Design

In the RF/microwave realm, the dielectric can be used to modify, compress or redirect electromagnetic energy. It can be used to reduce the size of antennas or other components or to change the path of electromagnetic energy through controlled reflections or lenses.

For all materials with $\beta>1$ (all dielectric materials) the wavelength will be compressed inside the dielectric compared to free space by a factor of $\beta$. For a low loss material, a very good approximation to $\beta$ is $\beta=\omega(\varepsilon^*\mu^*)^{0.5}$, where $\omega$ is the frequency of operation $\varepsilon^*$ is the effective permittivity and $\mu^*$ is the effective permamblity of the material. Hence for nonmagnetic material, $\mu^*=1$, wavelength compression inside the dielectric is proportional to the square root of the dielectric constant. This means a device made with a material with a higher effective permittivity can be made smaller than the same device with a lower effective permittivity.

The Dielectric can also be used to modify a wave by exploiting its reflection/transmission characteristics. At a dielectric interface, the incident, reflected and refracted waves must obey the boundary condition that the sum of E and H fields of the waves must be continuous. Requiring continuity of the amplitudes leads to Fresnel's equations. Continuity of phase leads to Snell's Law. Reflection from a dielectric interface depends on the polarization. There are two polarization states defined. Parallel polarization occurs when the E field vector is parallel to the plane of incidence. The plane of incidence is defined by the vector normal to the material and the propagation direction of the incident wave. Perpendicular polarization occurs when the E field vector is perpendicular to the plane of incidence.

By introducing the high dielectric nanocomposite material into polymers, RF devices that are both more easily manufactured and of lower weight and size can be created. Other dielectric materials typically used for RF purposes are heavier typically with a mass density of $>4.5$ $g/cm^3$, whereas polymer composites described herein have a mass density of around 1.8 $g/cm^3$. The extra weight limits their application in both consumer electronics and weight sensitive applications. A device made with a material with a higher effective permittivity can be made smaller than the same device with a lower effective permittivity and can also be used to modify a wave by exploiting its reflection/transmission characteristics.

A RF filter is made by utilizing the material as a dielectric waveguide, supporting TE (transverse electric) and TM (transverse magnetic) modes like a more conventional hollow metallic waveguide. Like a metallic waveguide, if the dielectric waveguide is truncated, standing waves will exist and it will behave as a resonant or anti-resonant cavity. The quality factor "Q" can be very high for a dielectric resonator and is proportional to the inverse of the material loss tangent. By properly configuring the shape of the dielectric waveguide various useful RF circuit filtering functions can be implemented such as low-pass, high-pass, band-pass, band-stop and notch filters to realize the overall circuit function.

Example 37. Hybrid Battery Capacitor for Energy Storage and Efficiency

A hybrid energy storage system is built by combining a batteries with capacitors. The first component is an energy storage device in the form of an electrochemical rechargeable battery such as lead-acid batteries, nickel cadmium batteries, nickel metal hydride batteries, lithium ion batteries, lithium polymer batteries, and combinations thereof having an electrode used as an anode and an electrode use as a cathode for providing a substantially constant power output. A second energy storage device, linked to the first energy storage, is a high capacitive dielectric core element deposited in parallel relation between said anode or cathode and a conductive outer layer. This deposited dielectric material is made of formulation similar to ANT1 This dielectric layer can provide intermittent bursts of high power output over the range of 0 to 10,000 volts, and performs in a wide temperature range between −50° C. and 330° C. while exhibiting a leakage current of less than 1 amp per liter of volume over the range of operating temperatures and at a voltage up to 10,000 volts.

What is claimed is:

1. An electronic device comprising a nanocomposite of carbon nanodomains homogeneously embedded in an insulating ceramic matrix, wherein the size and distribution of carbon nanodomains is such that the nanocomposite has a permittivity of greater than or equal to 200, and wherein the carbon nanodomains are thermally formed in situ via pyrolysis at a temperature of from about 800° C. to about 1500° C. during formation of the insulating ceramic matrix.

2. The electronic device of claim 1, wherein the carbon nanodomains comprise graphene.

3. The electronic device of claim 1, wherein the carbon nanodomains constitute between 5-40 vol % of the nanocomposite.

4. The electronic device of claim 1, wherein the carbon nanodomains comprise graphene, and wherein the graphene is in the form of single layers, stacks of 2-4 layers, or stacks of more than 4 layers, or combinations thereof.

5. The electronic device of claim 1, wherein the nanocomposite is a component in a dielectric material, wherein the dielectric material is a film.

6. The electronic device of claim 1, wherein the carbon nanodomains have dimensions of less than 20 nm.

7. The electronic device of claim 1, wherein the nanocomposite is further disposed within a second phase, the second phase comprising a polymer, ceramic, or glass material matrix.

8. The electronic device of claim 1, wherein the carbon nanodomains constitute between 5-40 vol % of the nanocomposite and do not constitute an electrical conduction path.

9. The electronic device of claim 1, wherein the carbon nanodomains volume does not constitute an electrical conduction path, and wherein the volume and distribution of carbon nanodomains provide a permittivity of the nanocomposite that is greater than or equal to 200.

10. The electronic device of claim 1, wherein the nanocomposite is further disposed within a second phase, the second phase comprising a polymer, ceramic, or glass material matrix, and wherein the carbon nanodomains comprise graphene that are single layers or stacks of 2-4 layers, and wherein the volume and distribution of the carbon nanodomains provide a permittivity of the nanocomposite that is greater than or equal to 200.

11. The electronic device of claim 1, wherein the nanocomposite is further disposed within a second phase, the second phase comprising a polymer, ceramic, or glass material matrix, and wherein the carbon nanodomains comprise graphene that forms stacks of more than 4 layers, and wherein the volume and distribution of carbon nanodomains provide a permittivity of the nanocomposite that is greater than or equal to 200.

12. The electronic device of claim 1, wherein the electronic device is selected from: a capacitor; a hybrid electrochemical battery capacitor; an RF-reactive circuit element; an RF filter; a DRA-type RF antenna; an energy storage device; a pulse power system; a capacitor energy storage device; a distributed capacitor in a microdevice; a component in a field effect transistor (FET); and an integrated component in a very large system integration (VLSI).

13. The electronic device of claim 1, wherein the carbon nanodomains are thermally formed in situ via pyrolysis at a temperature of from about 800° C. to about 1200° C. during formation of the insulating ceramic matrix.

14. An electronic device comprising a nanocomposite of carbon nanodomains homogeneously embedded in an insulating ceramic matrix, wherein the size and distribution of carbon nanodomains is such that the nanocomposite has a permittivity of greater than or equal to 200, wherein the carbon nanodomains have dimensions of less than about 20 nm, wherein the carbon nanodomains constitute between from about 5 vol % to about 40 vol % of the nanocomposite, and wherein the carbon nanodomains are thermally formed in situ via pyrolysis at a temperature of from about 800° C. to about 1200° C. during formation of the insulating ceramic matrix.

15. An electronic device comprising a nanocomposite of carbon nanodomains homogeneously embedded in an insulating ceramic matrix, wherein the size and distribution of carbon nanodomains is such that the nanocomposite has a permittivity of greater than or equal to 200, and wherein the nanocomposite is a component in a dielectric material, wherein the dielectric material is a film.

16. The electronic device of claim 15, wherein the carbon nanodomains comprise graphene.

* * * * *